(12) United States Patent
Lin et al.

(10) Patent No.: US 10,163,802 B2
(45) Date of Patent: Dec. 25, 2018

(54) FAN-OUT PACKAGE HAVING A MAIN DIE AND A DUMMY DIE, AND METHOD OF FORMING

(71) Applicant: Taiwan Semiconductor Manufacturing Company, Ltd., Hsinchu (TW)

(72) Inventors: Yan-Fu Lin, Zhubei (TW); Chen-Hua Yu, Hsinchu (TW); Meng-Tsan Lee, Hsinchu (TW); Wei-Cheng Wu, Hsinchu (TW); Hsien-Wei Chen, Hsinchu (TW)

(73) Assignee: Taiwan Semicondcutor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/583,690

(22) Filed: May 1, 2017

(65) Prior Publication Data

US 2018/0151502 A1 May 31, 2018

Related U.S. Application Data

(60) Provisional application No. 62/427,516, filed on Nov. 29, 2016.

(51) Int. Cl.
*H01L 23/538* (2006.01)
*H01L 23/00* (2006.01)
(Continued)

(52) U.S. Cl.
CPC ...... *H01L 23/5389* (2013.01); *H01L 23/5286* (2013.01); *H01L 23/5384* (2013.01); *H01L 24/13* (2013.01); *H01L 24/17* (2013.01); *H01L 24/19* (2013.01); *H01L 24/24* (2013.01); *H01L 24/25* (2013.01); *H01L 24/73* (2013.01); *H01L 25/105* (2013.01); *H01L 2224/13024* (2013.01);
(Continued)

(58) Field of Classification Search
CPC . H01L 23/5389; H01L 24/19; H01L 34/5286; H01L 24/25; H01L 23/5384; H01L 24/24; H01L 24/13; H01L 24/73; H01L 24/17; H01L 25/105; H01L 2224/24226; H01L 2224/25171; H01L 2224/24105; H01L 2224/13024; H01L 2224/17181; H01L 2224/73101; H01L 2224/73209; H01L 2224/73259; H01L 2225/1035; H01L 2225/1058
USPC ........ 257/774, 773, 668, 777, 723, 686, 685
See application file for complete search history.

(56) References Cited

U.S. PATENT DOCUMENTS 9,000,584 B2 4/2015 Lin et al.
9,006,030 B1* 4/2015 Kwon ............... H01L 23/562
438/108

(Continued)

*Primary Examiner* — Alexander Oscar Williams
(74) *Attorney, Agent, or Firm* — Slater Matsil, LLP

(57) ABSTRACT

A method of forming a package and a package are provided. The method includes placing a main die and a dummy die side by side on a carrier substrate. The method also includes forming a molding material along sidewalls of the main die and the dummy die. The method also includes forming a redistribution layer comprising a plurality of vias and conductive lines over the main die and the dummy die, where the plurality of vias and the conductive lines are electrically connected to connectors of the main die. The method also includes removing the carrier substrate.

20 Claims, 33 Drawing Sheets

(51) Int. Cl.
*H01L 23/528* (2006.01)
*H01L 25/10* (2006.01)

(52) U.S. Cl.
CPC ............... *H01L 2224/17181* (2013.01); *H01L 2224/24105* (2013.01); *H01L 2224/24226* (2013.01); *H01L 2224/25171* (2013.01); *H01L 2224/73101* (2013.01); *H01L 2224/73209* (2013.01); *H01L 2224/73259* (2013.01); *H01L 2225/1035* (2013.01); *H01L 2225/1058* (2013.01)

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,646,955 B2 * | 5/2017 | Yu .................... H01L 21/56 |
| 9,685,350 B2 * | 6/2017 | Lin .................. H01L 21/485 |
| 2016/0118332 A1 * | 4/2016 | Lin .................... H01L 22/20 257/773 |
| 2016/0322330 A1 * | 11/2016 | Lin .................. H01L 25/0652 |
| 2016/0358865 A1 * | 12/2016 | Shih ................. H01L 24/02 |
| 2017/0033062 A1 * | 2/2017 | Liu ..................... H01L 23/66 |
| 2017/0194292 A1 * | 7/2017 | Yu ................... H01L 21/4853 |
| 2017/0263470 A1 * | 9/2017 | Lin .................... H01L 24/19 |

* cited by examiner

FAN-OUT PACKAGE HAVING A MAIN DIE AND A DUMMY DIE, AND METHOD OF FORMING

PRIORITY CLAIM AND CROSS-REFERENCE

This application claims priority to U.S. Provisional Application No. 62/427,516, filed on Nov. 28, 2016, which is hereby incorporated by reference in its entirety.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. As aforementioned, the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged, and only "known-good-dies" are packaged. An advantageous feature of this packaging technology is the possibility of forming fan-out packages, which means the I/O pads on a die can be redistributed to a greater area than the die, and hence the number of I/O pads packed on the surfaces of the dies can be increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
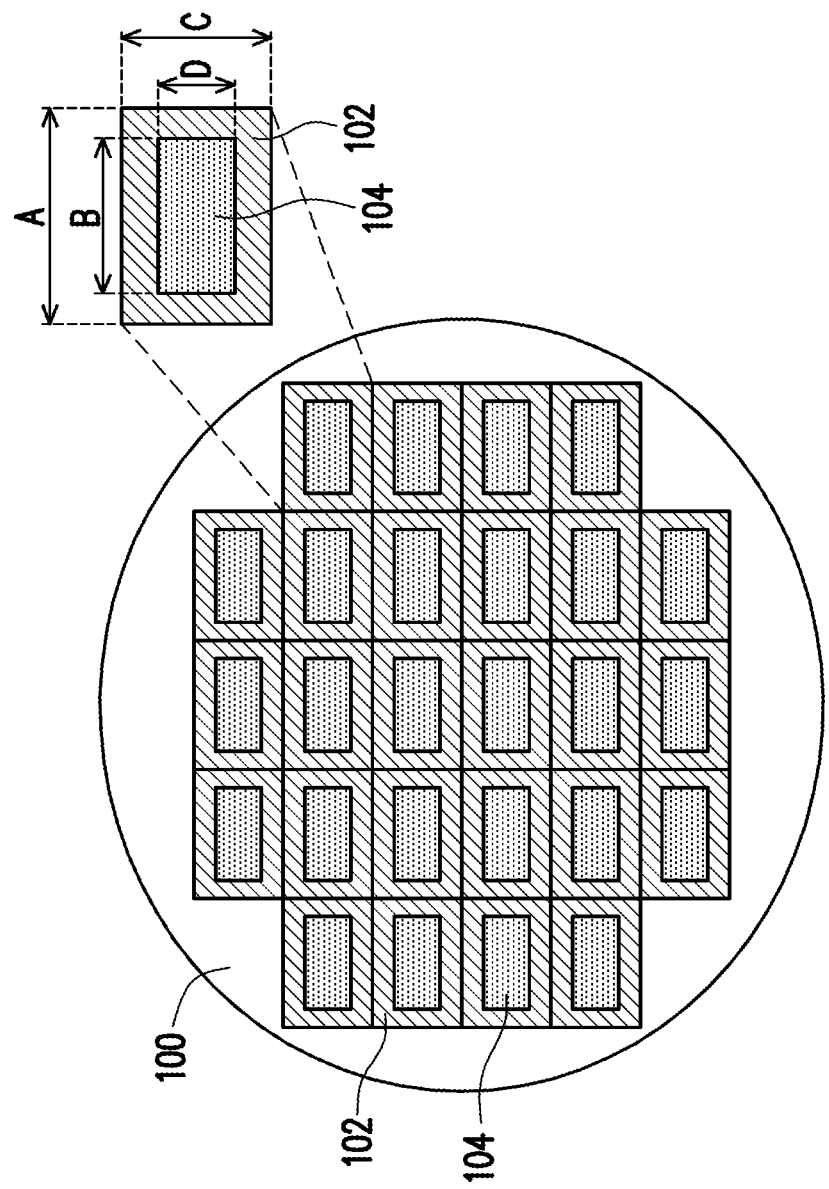
FIG. 1 is a plan view of a wafer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An Integrated Fan-Out ("InFO") package including one or more dummy dies and methods of forming the same are provided in accordance with various exemplary embodiments. A ratio of an area of the InFO package in a plan view to an area of the package covered by main dies and dummy die(s) may be less than about 2.5. The inclusion of the dummy dies and/or the lowering of the ratio to be less than or equal to about 2.5 may improve warpage characteristics of the InFO package. In some embodiments, the InFO package may experience less warpage and/or more symmetrical warpage when one or more dummy dies are included in the InFO package, and/or the ratio about 2.5 or less. The intermediate stages of forming the InFO package are illustrated and variations of embodiments are discussed.

Referring to FIG. 1, a plan view of a wafer 100 is depicted. Wafer 100 comprises a plurality of InFO packages 102 on a surface of the wafer 100. In some embodiments, InFO packages 102 may cover all or substantially all of the surface of wafer 100. Each InFO package 102 comprises one or more main dies 104. Although one main die 104 is depicted in each InFO package 102 of FIG. 1, in some embodiments more than one main die 104 may be present in each InFO package 102. InFO packages 102 may have the same number of main dies 104 as adjacent InFO packages 102, or InFO packages 102 may have different numbers of main dies 104 as adjacent InFO packages 102. Main dies 104 may have same dimensions in adjacent InFO packages 102, or main dies 104 may have different dimensions in adjacent InFO packages 102. Main dies 104 may be functional dies comprising circuits and/or active or passive devices. Any suitable main dies 104 may be included. For example, main dies 104 may include static random access memory (SRAM) chips or dynamic random access memory (DRAM) chips, processor chips, memory chips, logic chips, analog chips, digital chips, central processing units (CPUs), graphics processing units (GPUs), or a combination thereof, or the like.

A ratio of an area of the InFO package 102 in a plan view to an area covered by the one or more main dies 104 in the plan view of the InFO package 102 may be determined. In FIG. 1, the area of the InFO package 102 covered by the main die 104 is determined according to the relation: die_area=B×D, where B and D are lengths of sidewalls of a rectangular main die 104 in a plan view. If main die 104 has a different shape than a rectangle in a plan view, then any suitable relation for determining the area of the main die 104 in a plan view of the InFO package 102 may be used. The area of the InFO package 102 is determined according to the relation package_area=A×C, where A and C are sidewalls of a rectangular InFO package 102 in a plan view. If InFO package 102 has a different shape than a rectangle in a plan view, then any suitable relation for determining the area of the InFO package 102 in a plan view of the InFO package 102 may be used.

Figure 2A:
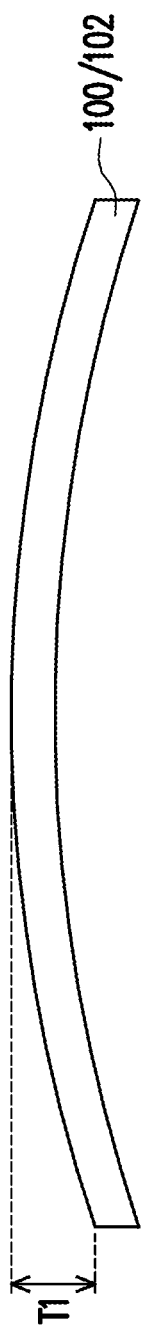
FIGS. 2A, 2B and 2C are cross-sectional views of devices in accordance with some embodiments.
Figure 2B:
Figure 2C:
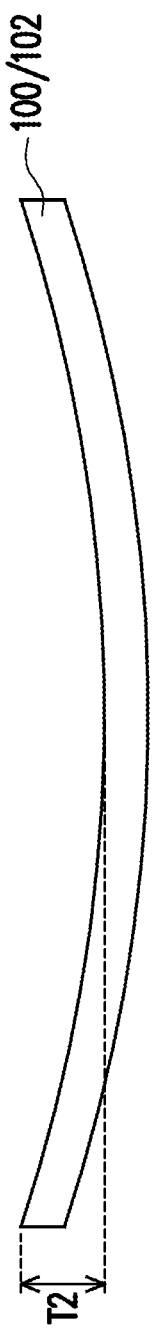

In some embodiments, when the ratio of the area of the InFO package 102 in the plan view to the area covered by the one or more main dies 104 in the plan view of the InFO package 102 is greater than about 2.5, then wafer 100 and/or respective InFO packages 102 may experience unacceptable warpage. For example, main dies 104 may have an effective CTE of around 3.0 due to the semiconductor material (e.g., silicon) present in such dies 104. The InFO packages may further comprise various other materials (e.g., a molding compound 42 and/or TIVs 33 (See FIGS. 12A-C)), which may have a higher effective CTE. The CTE mismatch between the main dies 104 and the other materials of the InFO package 102 may result in unacceptable warpage when the wafer 100 and the InFO packages 102 are at room temperature (e.g., around 25° Celsius) as well as when the wafer 100 and the InFO packages 102 are exposed to high temperatures (e.g., around 260° Celsius or higher) when the ratio is about 2.5 or greater. For example, wafer 100 may have an unacceptably large "crying" profile, as illustrated in FIG. 2A where a middle portion of the wafer 100 is higher than edge portions of the wafer 100. In some embodiments, a distance T1 between the middle portion of the wafer 100 and edge portions of the wafer 100, as illustrated in FIG. 2A, may be about 100 µm to about 1300 µm. The wafer 100 may also have an unacceptably large smiling profile, as illustrated in FIG. 2C. In some embodiments, a distance T2 between the middle portion of the wafer 100 and the edge portions of the wafer 100, as illustrated in FIG. 2C, may be about 100 µm to about 1300 µm. The warpage experienced by wafer 100 may be asymmetrical. The unacceptable warpage of wafer 100 may decrease performance and reliability of the wafer 100.

The unacceptable warpage of wafer 100 is attributable at least in part to unacceptable warpage of respective InFO packages 102 on the surface of wafer 100. For example, the respective InFO packages 102 may have an unacceptably large "crying" profile, as illustrated in FIG. 2A where a middle portion of the InFO package 102 is higher than edge portions of the InFO package 102. In some embodiments, a distance T1 between the middle portion of the InFO package 102 and edge portions of the InFO package 102, as illustrated in FIG. 2A, may be about 60 µm to about 120 µm. The InFO packages 102 may also have an unacceptably large smiling profile, as illustrated in FIG. 2C. In some embodiments, a distance T2 between the middle portion of the InFO packages 102 and the edge portions of the InFO packages 102, as illustrated in FIG. 2C, may be about 60 µm to about 120 µm. The warpage experienced by respective InFO packages 102 may be asymmetrical. The unacceptable warpage of respective InFO packages 102 may decrease performance and reliability of the InFO package 102.

Figure 3:
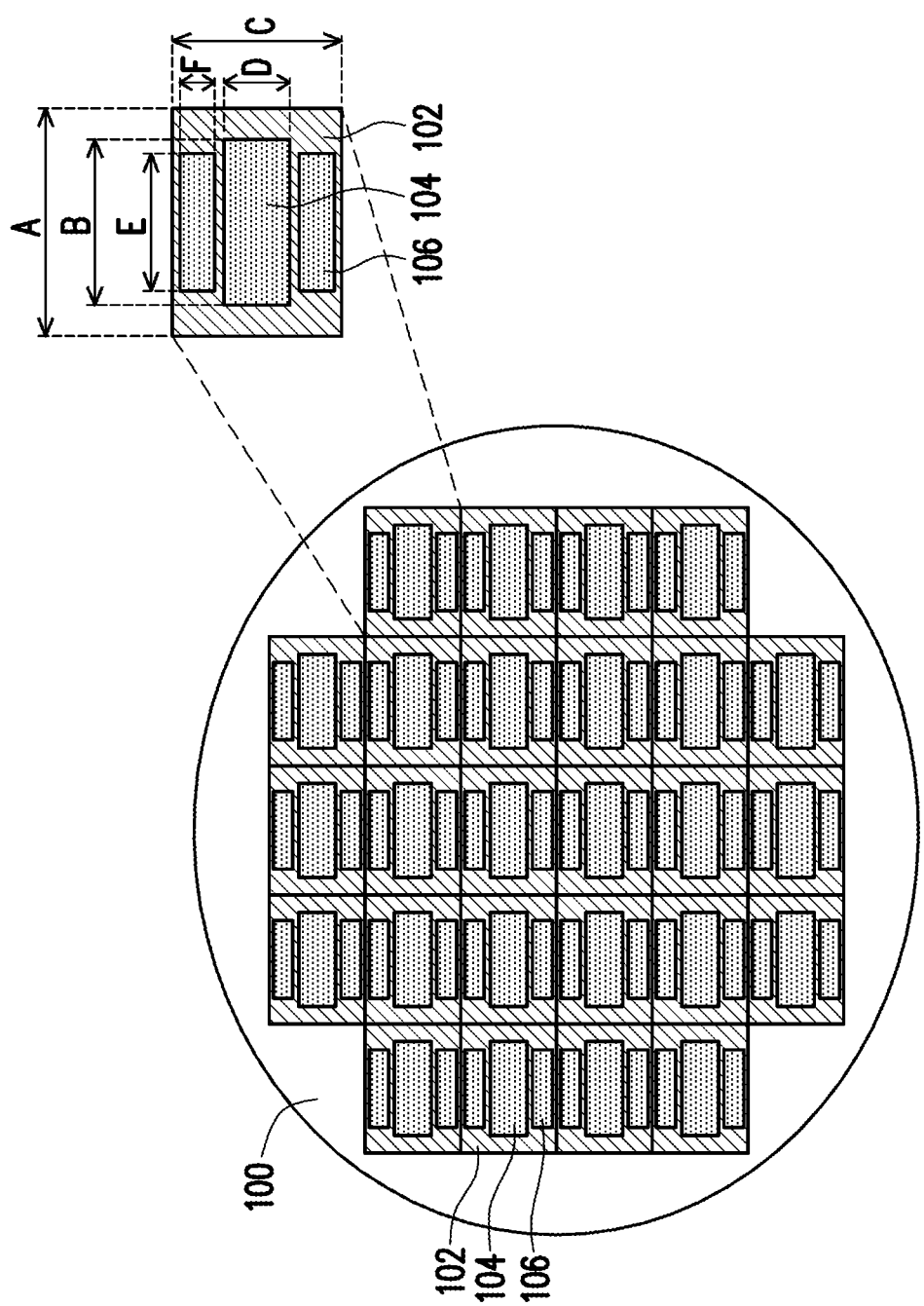
FIG. 3 is a plan view of a wafer in accordance with some embodiments.

Referring to FIG. 3, in some embodiments, one ore more dummy dies (e.g., dummy dies 106) may be inserted in InFO packages 102 in order to reduce CTE mismatch and improve the warpage profile of the resulting InFO packages 102 and wafer 100. A number of dummy dies 106, and a size of dummy dies 106, may be determined so that a ratio of the area of each InFO package 102 to the area of the InFO package 102 covered by the one or more main dies 104 and the dummy dies 106 in the plan view of the InFO package 102 is about 2.5 or less. While main dies 104 may be functional dies containing devices, circuits, and the like, dummy dies 106 may be non-functional dies and in some embodiments may not contain any devices and/or functional electrical circuits.

In some embodiments, the size of one of the dummy dies 106 may be determined according to the relation dummy_area=F×E, where F and E are dimensions of sidewalls of a rectangular dummy die 106 in a plan view of the InFO package 102. When dummy die 106 is not rectangular in shape, any suitable relation may be used to determine the area of the dummy die in the plan view of the InFO package 102. If an InFO package 102 comprises more than one dummy die 106, the area covered by each dummy die may in an InFO package 102 be determined, and a total area covered by all dummy dies in the InFO package (total_dummy_area) may be determined by adding the areas covered by each dummy die.

The area of the InFO package covered by the main die 104 is determined according to the relation die_area=B×D, where B and D are lengths of sidewalls of a rectangular main die 104 in a plan view. If main die 104 has a different shape than a rectangle in a plan view, then any suitable relation for determining the area of the main die 104 in a plan view of the InFO package 102 may be used. If an InFO package 102 comprises more than one main die 104, the area covered by each main die 104 in an InFO package 102 be determined, and a total area covered by all main dies 104 in the InFO package 102 (total_die_area) may be determined by adding the areas covered by each main die 104.

The area of the InFO package 102 is determined according to the relation package_area=A×C, where A and C are sidewalls of a rectangular InFO package 102 in a plan view. If InFO package 102 has a different shape than a rectangle in a plan view, then any suitable relation for determining the area of the InFO package 102 in a plan view of the InFO package 102 may be used.

The ratio of the of the area of the InFO package 102 to the area of the InFO package 102 covered by the one or more main dies 104 and the dummy dies 106 in the plan view may then be determined according to the relation ratio=package_area/(total_die_area+total_dummy_area). When the ratio is about 2.5 or less, warpage experienced by the respective InFO packages 102 and the wafer 100 may be reduced and/or more symmetrical. In some embodiments, when wafer 100 comprises InFO packages 102 having a ratio of about 2.5 or less, wafer 100 may have a substantially level lateral surface as illustrated by FIG. 2B. By including dummy dies 106 and lowering the ratio to 2.5 or less, a difference between a highest and lowest point of the wafer 100 having a crying profile (dimension T1 in FIG. 2A) may be reduced. In some embodiments, a distance T1 between the middle portion and the edge portions may be about 50 µm to about 1100 µm By including dummy dies 106 and lowering the ratio to 2.5 or less, a difference between a highest and lowest point of the wafer 100 having a smiling profile (dimension T2 in FIG. 2C) may be reduced. In some embodiments, a distance T2 between the middle portion and the edge portions may be about 50 µm to about 1100 µm.

In some embodiments, respective InFO packages 102 having a ratio of about 2.5 or less may also result in the InFO packages 102 having substantially level lateral surfaces as illustrated by FIG. 2B. By including dummy dies 106 and lowering the ratio to 2.5 or less, a difference between a highest and lowest point of respective InFO packages 102 having a crying profile (dimension T1 in FIG. 2A) may be reduced. In some embodiments, a distance T1 between the middle portion and the edge portions may be about 0 µm to about 55 µm. By including dummy dies 106 and lowering the ratio to 2.5 or less, a difference between a highest and lowest point of respective InFO packages 102 having a smiling profile (dimension T2 in FIG. 2C) may be reduced. In some embodiments, a distance T2 between the middle portion and the edge portions may be about 0 µm to about 55 µm.

Dummy dies 106 may comprise any suitable material for adjusting the effective CTE of the InFO package 102 to a desired level. The dummy dies 106 may include a material for lowering the effective CTE of an InFO package 102, such as silicon, glass or ceramic. In other embodiments, the dummy die 106 may include a material for raising the effective CTE, such as copper or a polymer. In some embodiments, dummy dies 106 are composed of or comprise the same materials that are comprised in the main dies 104. For example, in some embodiments dummy dies 106 may be selected so that an effective CTE of the dummy dies 106 are the same or similar to an effective CTE of the main dies 104.

Figure 4:
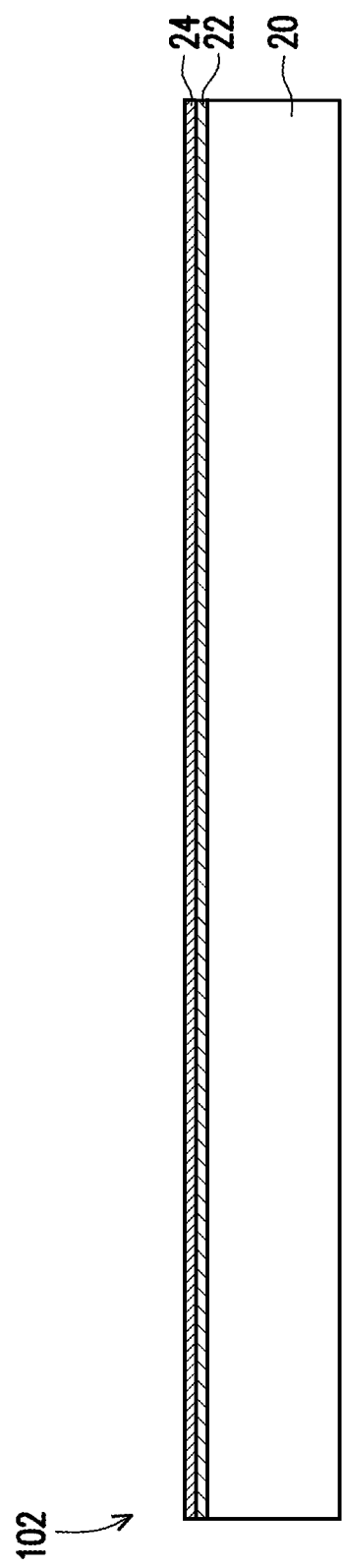
FIGS. 4 through 9 are cross-sectional views of an intermediate stage in the manufacture of a fan-out package in accordance with some embodiments.

FIGS. 4 through 16A-D illustrate cross-sectional views of intermediate steps in forming a semiconductor package in accordance with some embodiments. Referring first to FIG. 4, there is shown a carrier substrate 20 having a release layer 22 formed thereon. Generally, the carrier substrate 20 provides temporary mechanical and structural support during subsequent processing steps. The carrier substrate 20 may include any suitable material, such as, for example, silicon based materials, such as a silicon wafer, glass or silicon oxide, or other materials, such as aluminum oxide, a ceramic material, combinations of any of these materials, or the like. In some embodiments, the carrier substrate 20 is planar in order to accommodate further processing.

The release layer 22 is an optional layer formed over the carrier substrate 20 that may allow easier removal of the carrier substrate 20. As explained in greater detail below, various layers and devices will be placed over the carrier substrate 20, after which the carrier substrate 20 may be removed. The optional release layer 22 aids in the removal of the carrier substrate 20, reducing damage to the structures formed over the carrier substrate 20. The release layer 22 may be formed of a polymer-based material. In some embodiments, the release layer 22 is an epoxy-based thermal release material, which loses its adhesive property when heated, such as a Light-to-Heat-Conversion (LTHC) release coating. In other embodiments, the release layer 22 may be an ultra-violet (UV) glue, which loses its adhesive property when exposed to UV light. The release layer 22 may be dispensed as a liquid and cured. In other embodiments, the release layer 22 may be a laminate film laminated onto the carrier substrate 20. Other release layers may be utilized.

Referring to FIG. 4, buffer layer 24 is formed over release layer 22. Buffer layer 24 is a dielectric layer, which may be a polymer (such as polybenzoxazole (PBO), polyimide, benzocyclobutene (BCB), or the like), a nitride (such as silicon nitride or the like), an oxide (such as silicon oxide, PhosphoSilicate Glass (PSG), BoroSilicate Glass (BSG), Boron-doped PhosphoSilicate Glass (BPSG), or a combination thereof, or the like), or the like, and may be formed, for example, by spin coating, lamination, Chemical Vapor Deposition (CVD), or the like. In some embodiments, buffer layer 24 is a planar layer having a uniform thickness, wherein the thickness may be between about 2 µm and about 6 µm. The top and the bottom surfaces of buffer layer 24 are also planar.

Referring now to FIGS. 5 to 9, there is shown an optional formation of through vias ("TVs") 33 (see FIG. 9) in accordance with some embodiments. The through vias 33 provide an electrical connection from one side of the InFO package 102 to another side of the InFO package 102. For example, as will be explained in greater detail below, a main die 104 and a dummy die 106 will be mounted to the buffer layer 24 and a molding compound will be formed around the through vias and the die. Subsequently, another device, such as another die, package, substrate, or the like, may be attached to the die and the molding compound. The through vias 33 provide an electrical connection between the another device and the backside of the package without having to pass electrical signals through the main die 104 mounted to the buffer layer 24.

Figure 5:
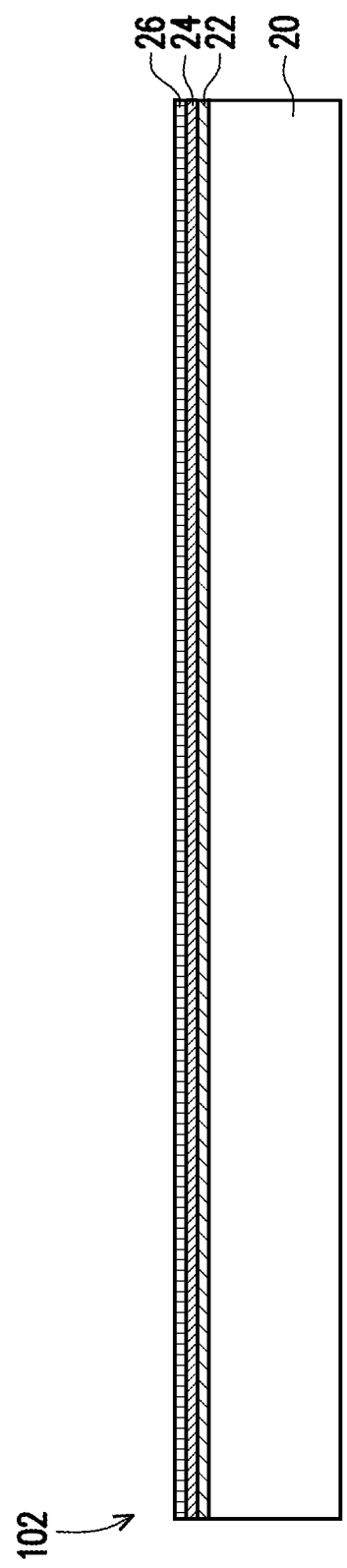

The through vias 33 may be formed, for example, by forming a conductive seed layer 26 over the buffer layer 24, as shown in FIG. 5. In some embodiments, seed layer 26 is a metal layer, which may be a single layer or a composite layer comprising a plurality of sub-layers formed of different materials. Seed layer 26 may be made of copper, titanium, nickel, gold, or a combination thereof, or the like. In some embodiments, seed layer 26 comprises a titanium layer and a copper layer over the titanium layer. Seed layer 26 may be formed using, for example, physical vapor deposition (PVD), CVD, atomic layer deposition (ALD), a combination thereof, or the like. In some embodiments, seed layer 26 comprises a titanium layer and a copper layer over the titanium layer. In alternative embodiments, seed layer 26 is a copper layer.

Figure 6:
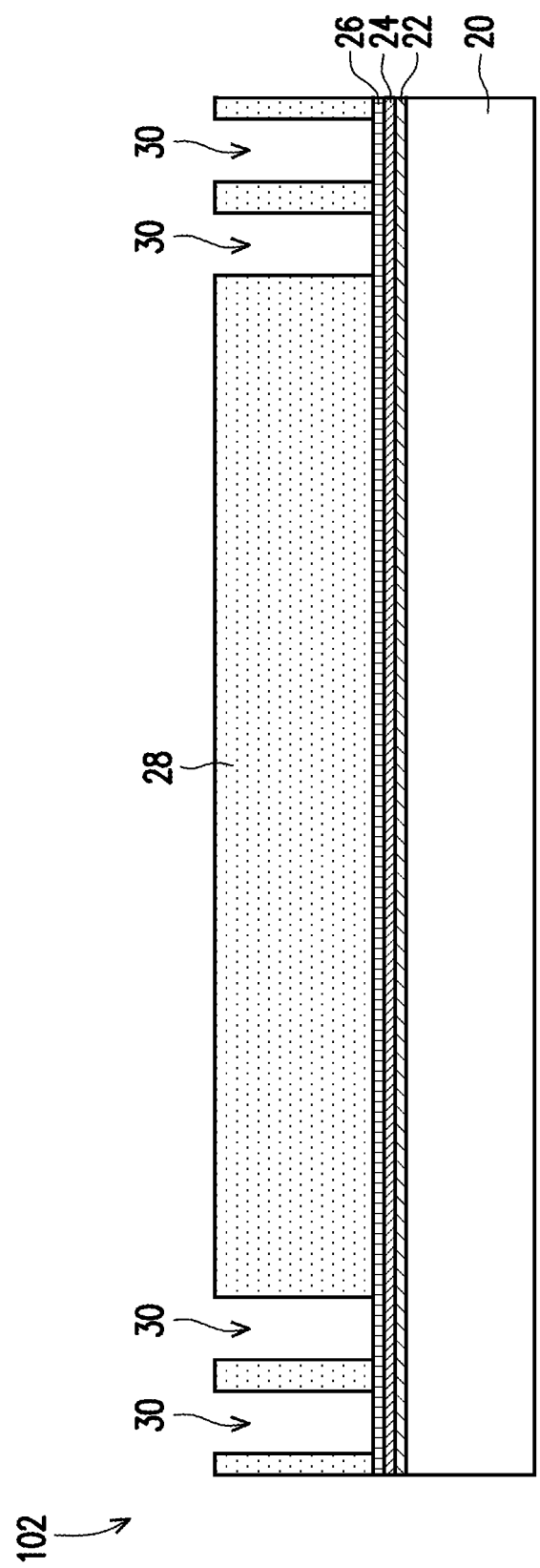
Figure 7:
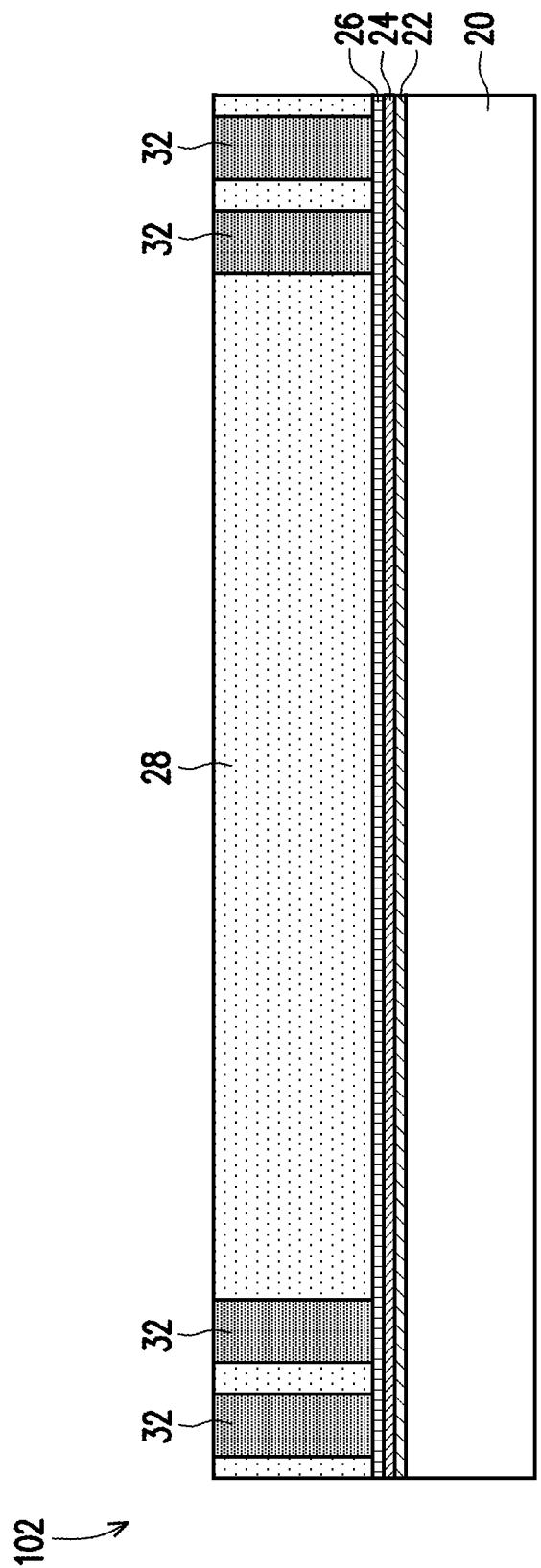

Turning to FIG. 6, a mask layer, such as patterned photoresist layer 28, may be deposited and patterned, wherein openings 30 in the mask layer expose the seed layer 26. Referring to FIG. 7, openings 30 may be filled with a conductive material using, for example, an electroless plating process or an electrochemical plating process, thereby creating metal features 32. The plating process may unidirectionally fill openings (e.g., from seed layer 26 upwards) in the patterned photoresist layer 28. Uni-directional filling may allow for more uniform filling of such openings. Alternatively, another seed layer may be formed on sidewalls of openings 30 in the patterned photoresist layer 28, and such openings may be filled multi-directionally. Metal features 32 may comprise copper, aluminum, tungsten, nickel, solder, or alloys thereof. The top-view shapes of metal features 32 may be rectangles, squares, circles, or the like. The heights of metal features 32 are determined by the thickness of the subsequently placed main dies 104 and/or dummy dies 106 (shown in FIGS. 10A-C), with the heights of metal features 32 greater than the thickness of main dies 104 and/or dummy dies 106 in some embodiments.

Figure 8:
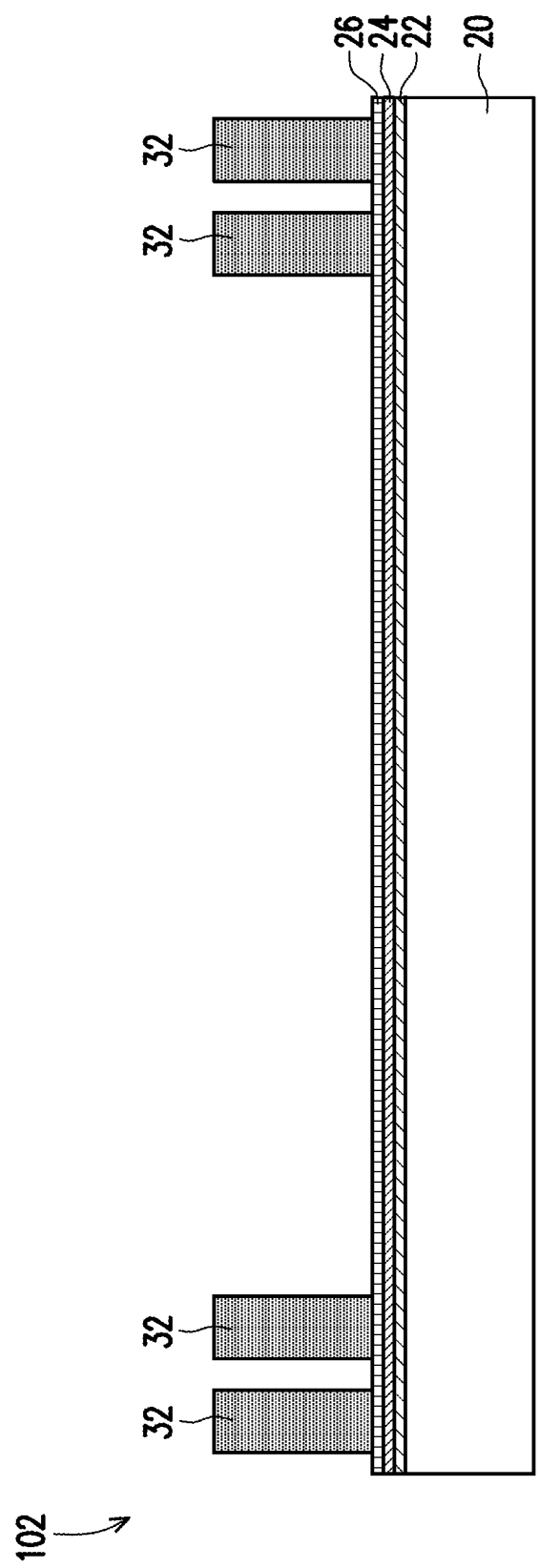
Figure 9:
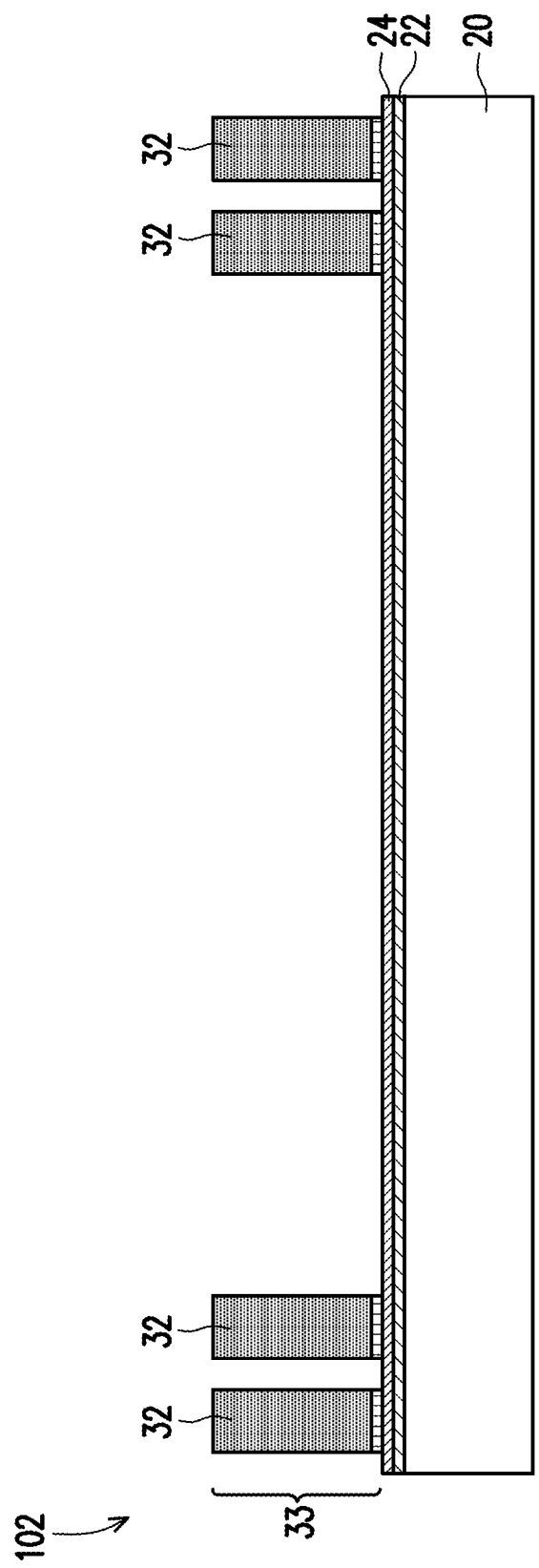

Next, the mask layer may be removed, for example in an ashing and/or wet strip process, as shown in FIG. 8. Referring to FIG. 9, an etch step is performed to remove the exposed portions of seed layer 26, wherein the etching may be an anisotropic etching. The portions of seed layer 26 that are overlapped by metal features 32, on the other hand, remain not etched. Metal features 32 and the remaining underlying portions of seed layer 26 form through vias 33. Although seed layer 26 is shown as a layer separate from metal features 32, when seed layer 26 is formed of a material similar to or the same as the respective overlying metal features 32, seed layer 26 may be merged with metal features 32 with no distinguishable interface between. In some embodiments, there exist distinguishable interfaces between seed layer 26 and the overlying metal features 32. The through vias 33 can also be realized with metal wire studs placed by a wire bonding process, such as a copper wire bonding process. The use of a wire bonding process may eliminate the need for depositing seed layer 26, depositing and patterning mask layer 28, and plating to form the through vias 33.

Figure 10A:
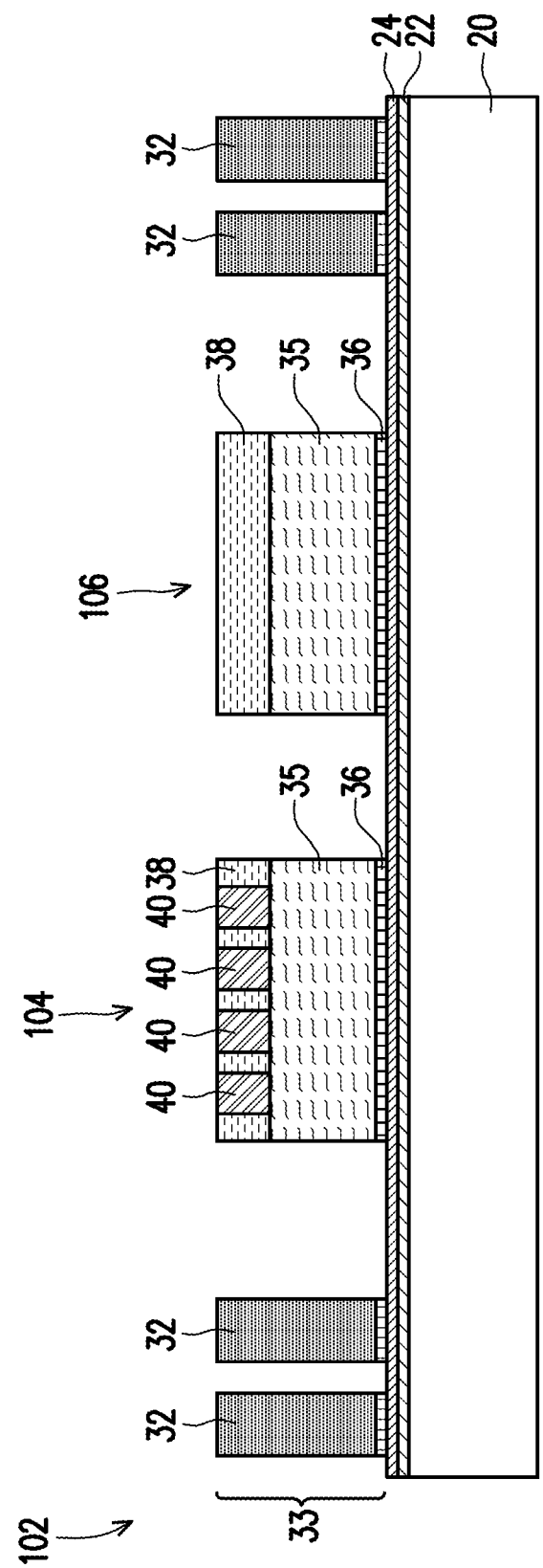
FIGS. 10A, 10B and 10C are cross-sectional views of an intermediate stage in the manufacture of a fan-out package in accordance with some embodiments.
Figure 10B:
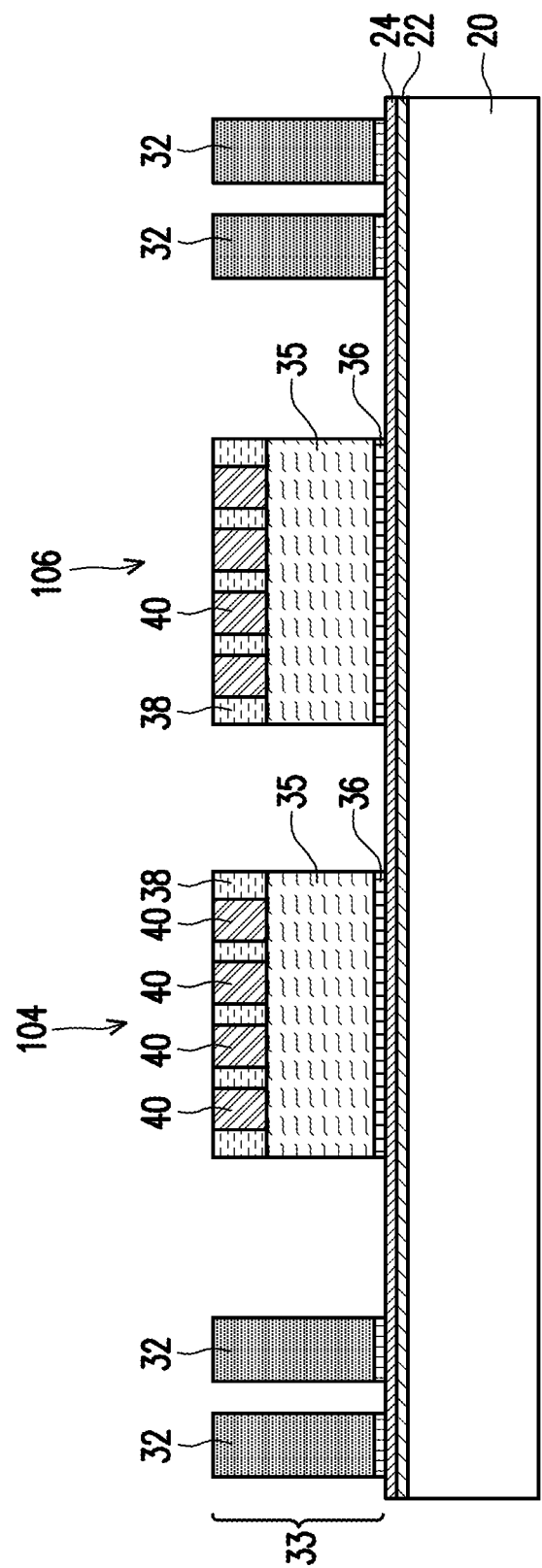
Figure 10C:
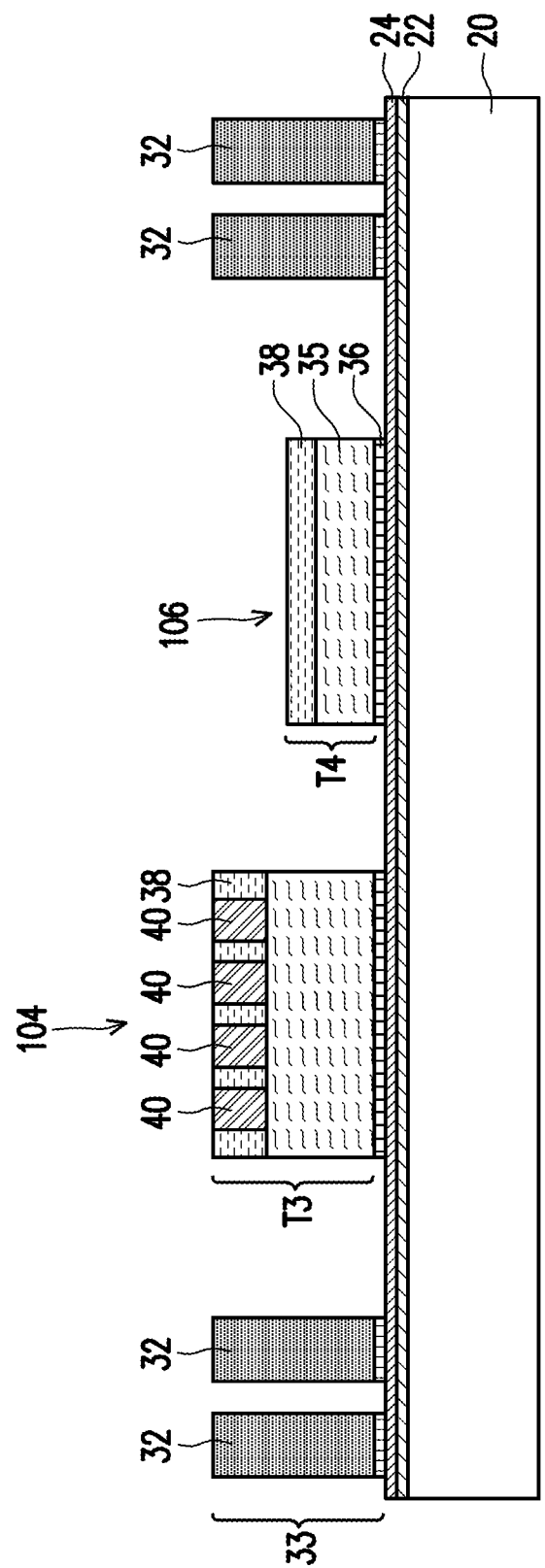

FIGS. 10A-C illustrated attaching a main die 104 and a dummy die 106 to the backside of buffer layer 24 in accordance with some embodiments. Each of main die 104 and dummy die 106 are adhered to buffer layer 24 by an adhesive layer 36, such as a die-attach film (DAF). A thickness of the adhesive layer 36 may be in a range from about 5 μm to about 50 μm, such as about 10 um. One main die 104 and one dummy die 106 may be used as illustrated in FIGS. 10A-C, or in some embodiments more than one main die 104 and/or more than one dummy die 106 may be used. For each of the embodiments depicted in FIGS. 10A-10C, a ratio of an area of the InFO package 102 in a plan view to an area of the InFO package 102 covered by the main die(s) 104 and the dummy die(s) 106 is about 2.5 or less. As such, the InFO packages 102 depicted in each of FIGS. 10A-C may experience reduced warpage and/or more symmetric warpage, which may increase reliability and increase performance of the InFO package 102.

The main die(s) 104 and the dummy die(s) 106 may be attached to a suitable location for a particular design or application. For example, FIGS. 10A-C illustrate an embodiments in which the main die 104 and the dummy die 106 are mounted in a center region wherein the through vias 33 are positioned around a perimeter. In other embodiments, the main die 104 and/or the dummy die 106 may be offset from a center.

Before being attached to the buffer layer 24, the main die 104 may be processed according to applicable manufacturing processes to form integrated circuits in the main die 102. Main dies 104 may include a semiconductor substrate 35, where a backside of the semiconductor substrate is attached to adhesive layer 36. In some exemplary embodiments, main die 104 includes metal pillars 40 (such as copper posts) that are electrically coupled to devices such as transistors (not shown) in main dies 104. In some embodiments, dielectric layer 38 is formed at the top surface of the main dies 104, with metal pillars 40 having at least lower portions in dielectric layer 38. The top surfaces of metal pillars 40 may also be level with the top surfaces of dielectric layer 38 in some embodiments. Alternatively, dielectric layer 38 is not formed, and metal pillars 40 protrude above a top layer of the respective main die 104.

FIGS. 10A-C depict various embodiments of dummy dies 106 that may be included in InFO package 102. In FIGS. 10A-C through 15A-D, Figures ending in "A" depict a first embodiment, figures ending in "B" depict a second embodiment, Figures ending in "C" depict a third embodiment, and Figures ending in "D" depict a fourth embodiment.

Referring to FIG. 10A, dummy die 106 may include a semiconductor substrate 35, where a backside of the semiconductor substrate 35 is attached to adhesive layer 36. In some embodiments, semiconductor substrate 35 may comprise a same material as semiconductor substrate 35 of main die 104. A dielectric layer 38 is optionally included on a surface of semiconductor substrate 35 of dummy die 106 that is opposite to the surface that contacts the adhesive layer. Dielectric layer 38 of dummy die 106 may comprise a same material as dielectric layer 38 of main die 104. In the embodiment depicted in FIG. 10A, electrical contacts (such as metal pillars 40) are not included in the dummy die 106. Alternatively, metal pillars 40 are included in dielectric layer 38 of dummy die 106, as shown in FIG. 10B. In some embodiments metal pillars 40 comprise copper or the like.

Dummy die 106 has a same thickness as main die 104 in the embodiments depicted in FIG. 10A and FIG. 10B, where the thickness is measured in a direction that is parallel to through vias 33. Alternatively, as depicted in FIG. 10C, dummy die 106 may have a thickness that is less than the thickness of main die 104. In some embodiments, main die 104 may have a thickness T3 of 40 μm to 300 μm, while dummy die 106 may have a thickness T4 of 40 μm to 300 μm. In some embodiments, a ratio of thickness T4 of the dummy die 106 to a thickness T3 of the main die 104 may be about 40% to about 100%.

Figure 11A:
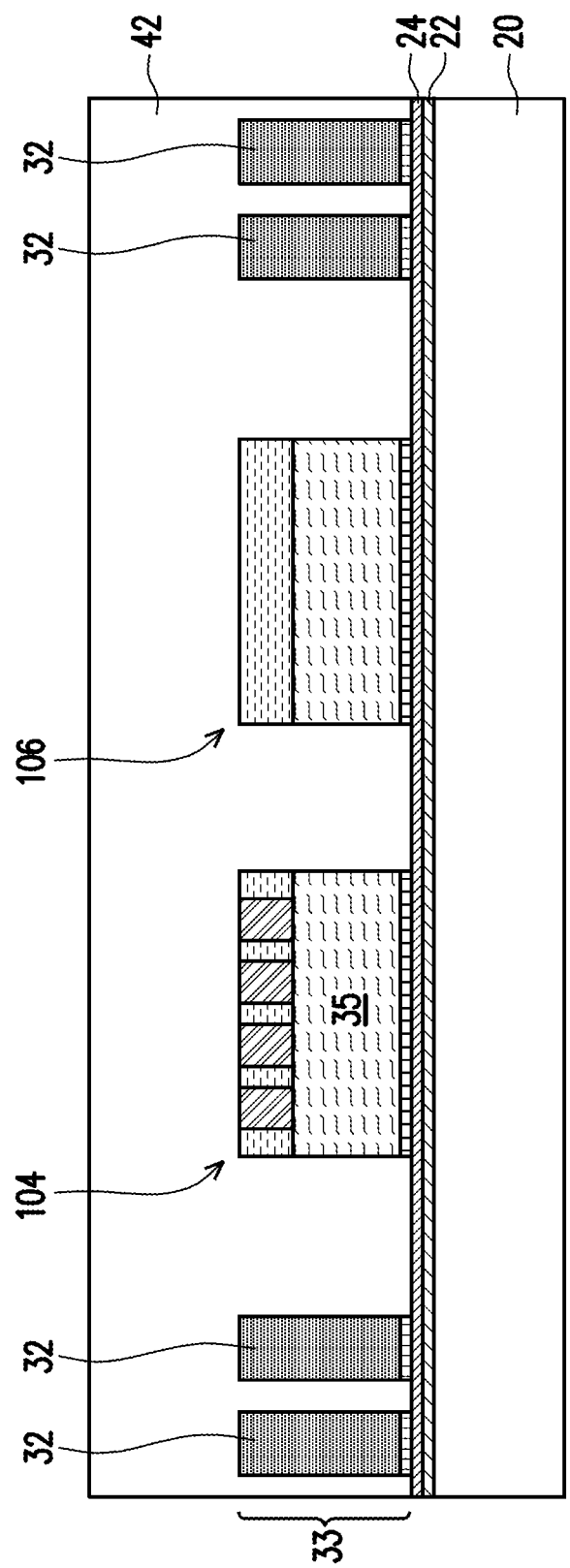
FIGS. 11A, 11B and 11C are cross-sectional views of an intermediate stage in the manufacture of a fan-out package in accordance with some embodiments.
Figure 11B:
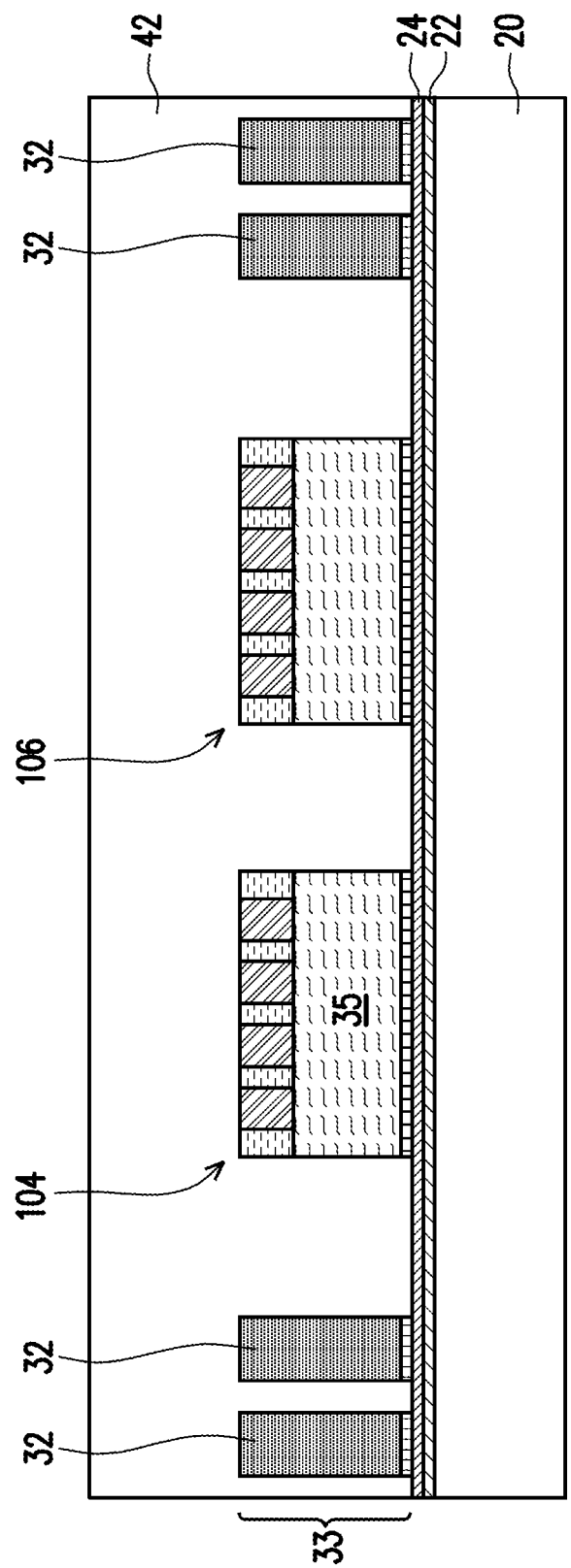
Figure 11C:
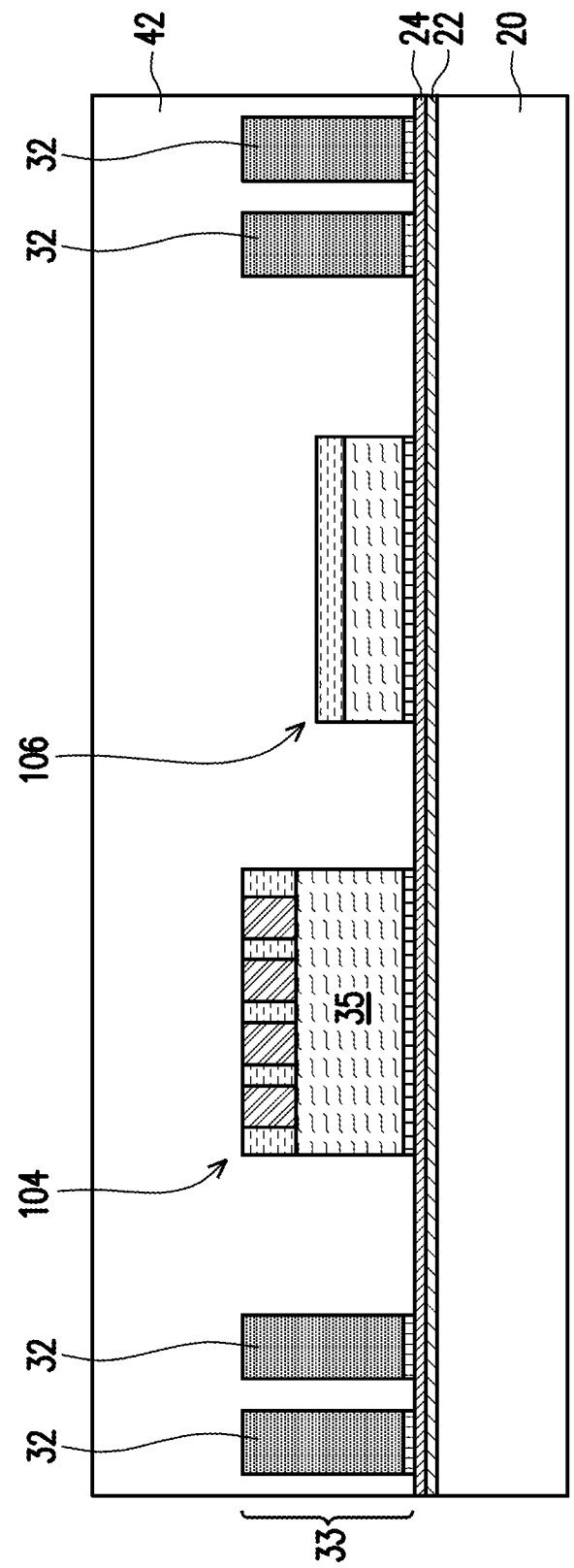

Referring to FIGS. 11A-C, molding material 42 is molded on main dies 104, dummy dies 1106 and TVs 33. Molding material 42 fills the gaps between main die 104 and main die 106, between main die 104 and and TVs 33, and between dummy die 106 and TVs 33, and may be in contact with buffer layer 24. Furthermore, molding material 42 is filled into the gaps between metal pillars 40 when metal pillars 40 are protruding metal pillars. The molding material 42 may be molded on the main die 104, dummy die 106, and TVs 33, for example, using compression molding. In some embodiments, the molding material 42 is a molding compound, a polymer, an epoxy, silicon oxide filler material, the like, or a combination thereof. A curing step may be performed to cure the molding material 42, wherein the curing may be a thermal curing, a UV curing, the like, or a combination thereof. The top surface of molding material 42 is higher than the top ends of metal pillars 40 on main die 104 and TVs 33.

Figure 12A:
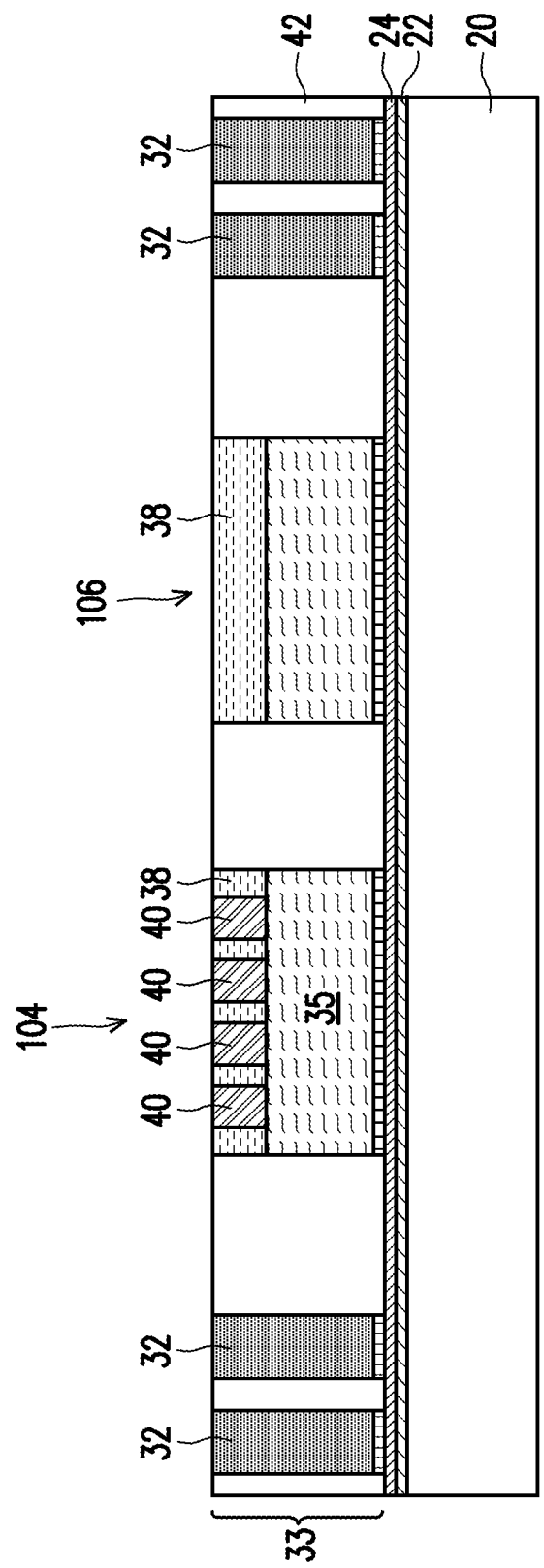
FIGS. 12A, 12B and 12C are cross-sectional views of an intermediate stage in the manufacture of a fan-out package in accordance with some embodiments.
Figure 12B:
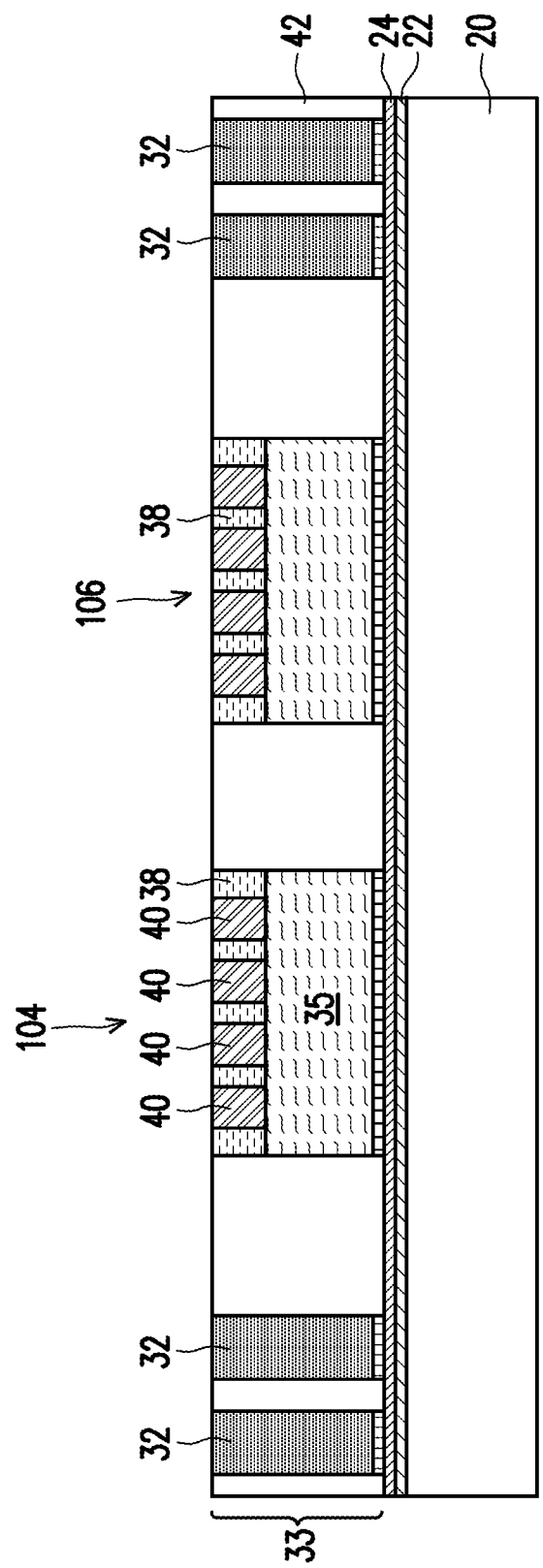
Figure 12C:
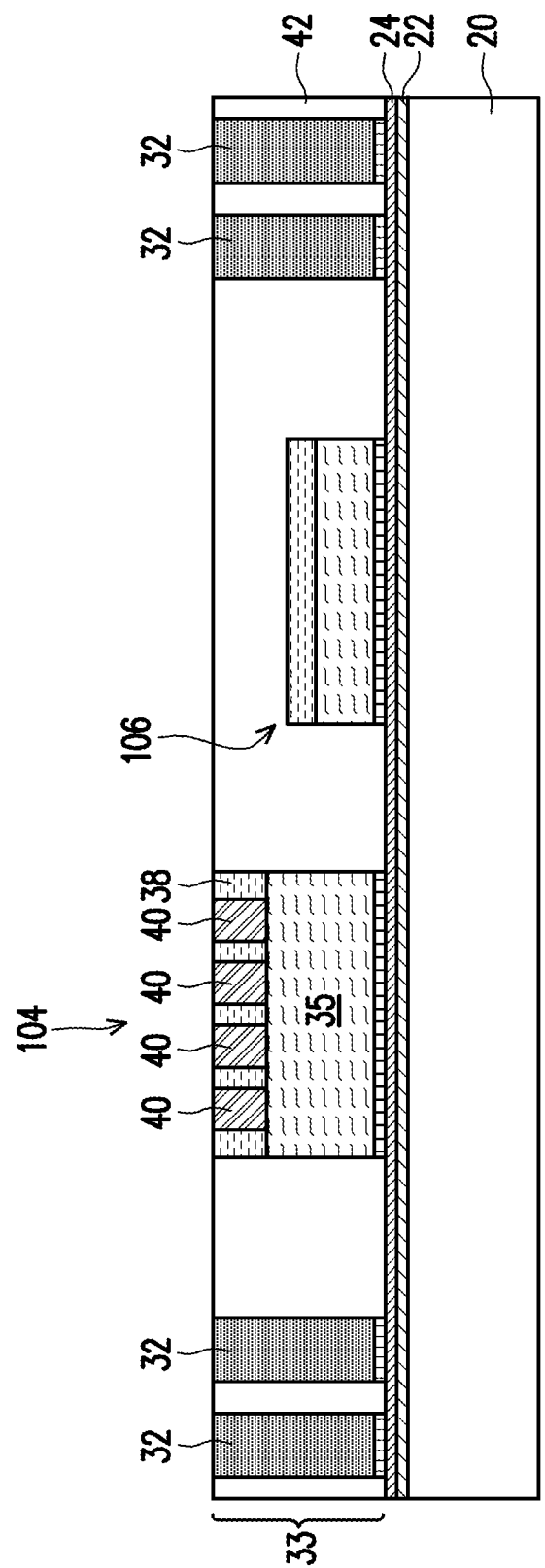

Next, a grinding step is performed to thin molding material 42, until metal pillars 40 on main die 104 and TVs 33 are exposed. The resulting structures are shown in FIGS. 12A-C. Due to the grinding, the top ends of metal features 32 are substantially level (coplanar) with the top ends of metal pillars 40 on main die 104, and are substantially level (coplanar) with the top surface of molding material 42. In embodiments in which dummy die 106 has a same thickness as main die 104, the grinding step exposes a top surface of dummy die 106. For example, the grinding process may expose a dielectric layer 38 of dummy die 106 and/or metal pillars 40 of dummy die 106.

In embodiments in which dummy die 106 has a thickness that is less than a thickness of main die 104, the grinding step does not expose the dummy die 106 as shown in FIG. 12C. After the grinding step, molding material covers the surface of dummy die 106 that is farthest from the carrier substrate 20.

As a result of the grinding, metal residues such as metal particles may be generated, and left on the top surfaces of the molding material 42 and main die 104. Accordingly, after the grinding, a cleaning may be performed, for example, through a wet etching, so that the metal residue is removed.

Figure 13A:
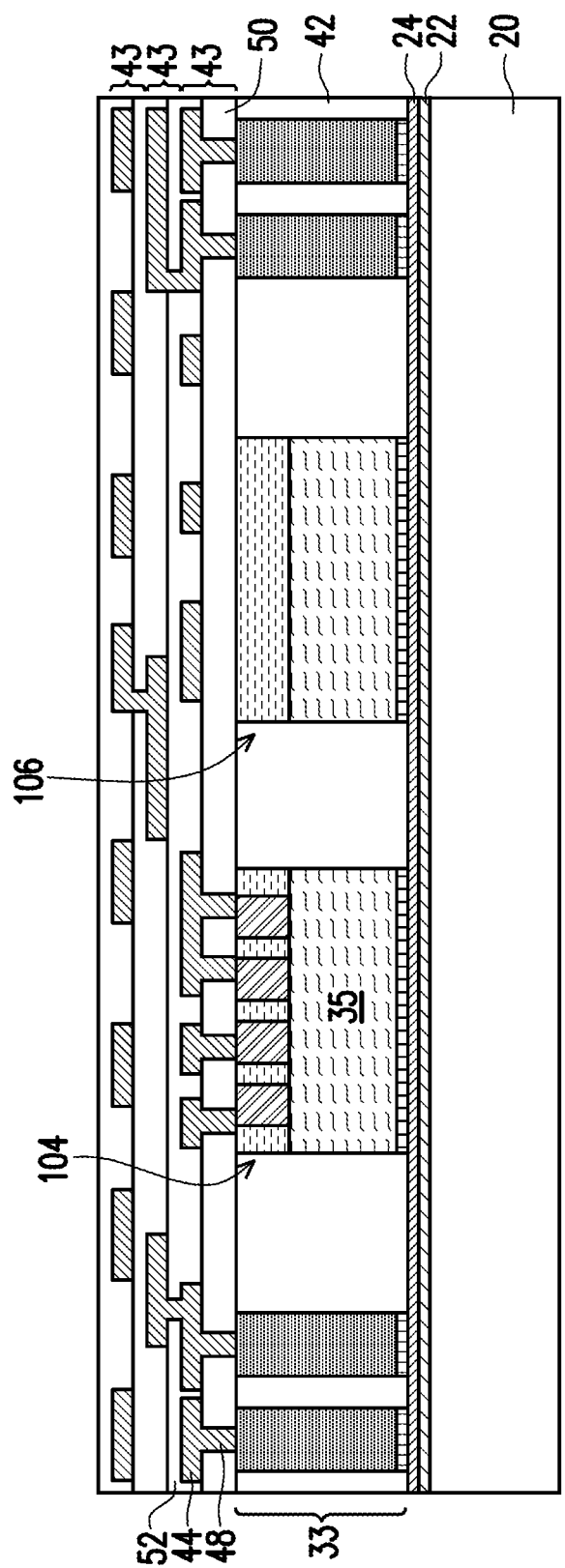
FIGS. 13A, 13B, 13C and 13D are cross-sectional views of an intermediate stage in the manufacture of a fan-out package in accordance with some embodiments.
Figure 13B:
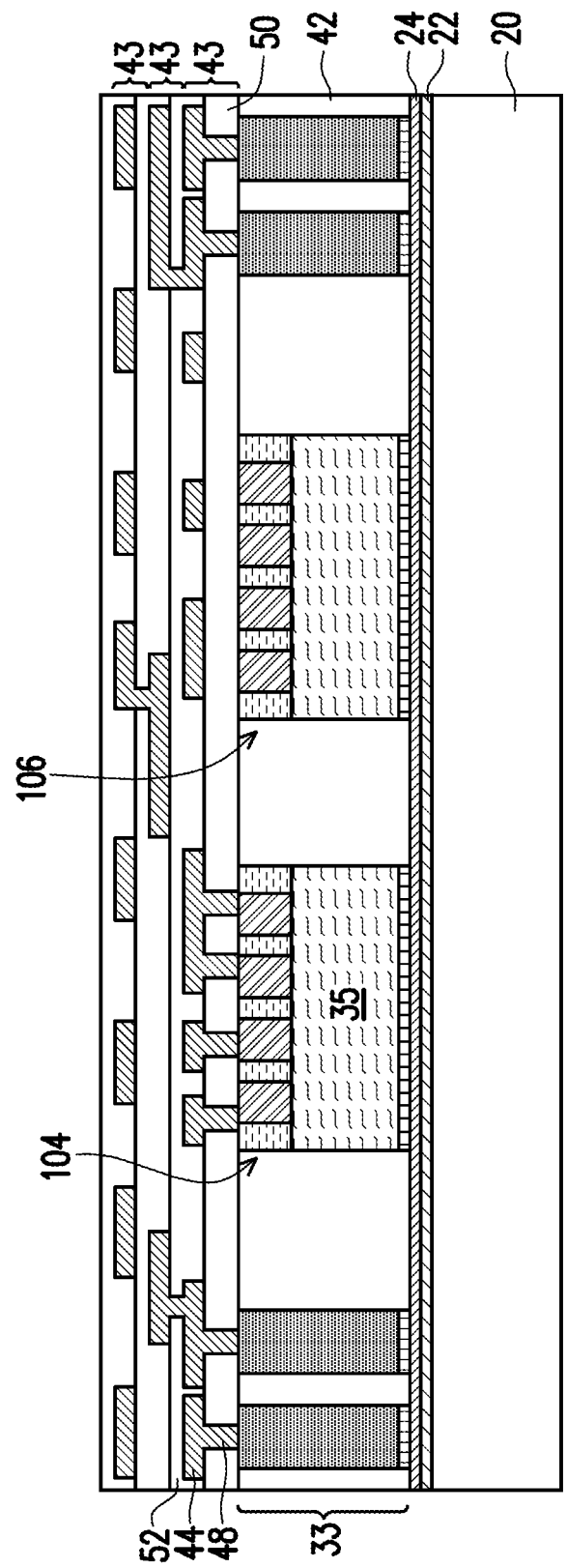
Figure 13C:
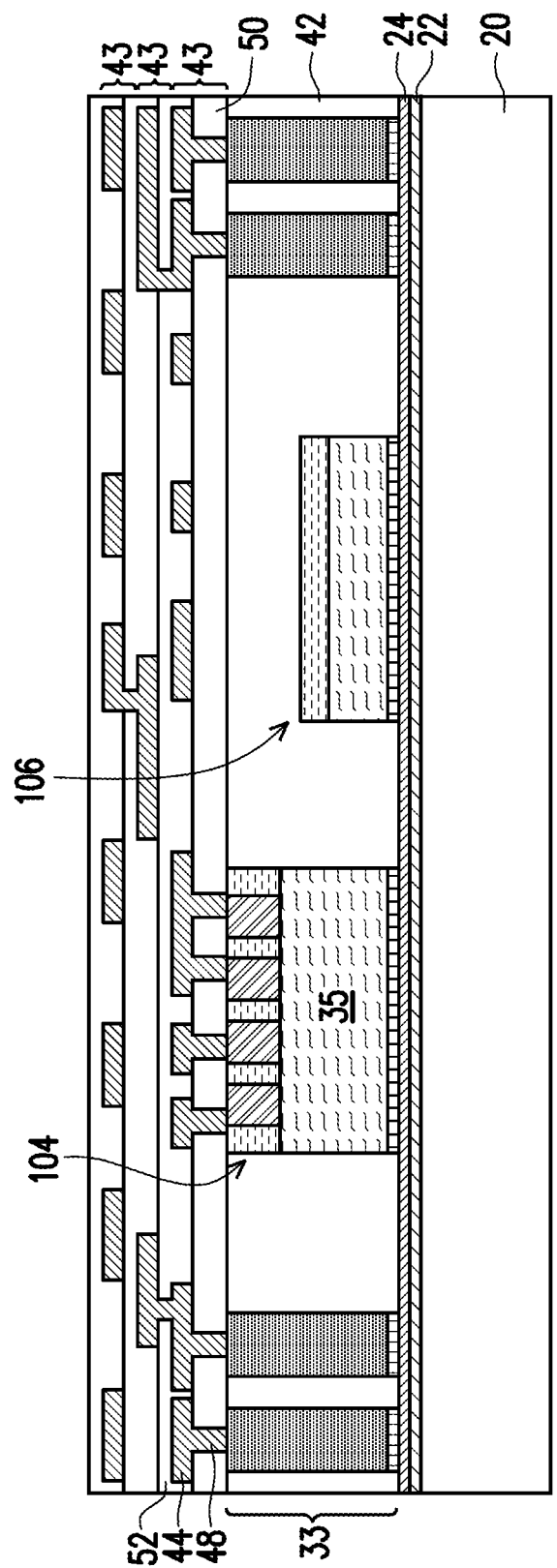

Next, referring to FIGS. 13A-C, one or more redistribution layers (RDLs) 43 are formed. Generally, RDLs provide a conductive pattern that allows a pin-out contact pattern for a completed package different than the pattern of through vias 33 and/or metal pillars 40, allowing for greater flexibility in the placement of through vias 33 and main dies 104. The RDLs may be utilized to provide an external electrical connection to main die 104 and/or to through vias 33. The RDLs may further be used to electrically couple main dies 104 to through vias 33, which may be electrically coupled to one or more other packages, package substrates, components, the like, or a combination thereof. The RDLs comprise conductive lines 44 and via connections 48, wherein via connections 48 connect an overlying line (e.g., an overlying conductive lines 44) to an underlying conductive feature (e.g., through vias 33, metal pillars 40, and/or conductive lines 44). Conductive lines 44 may extend along any direction. FIGS. 13A-C illustrates three layers of RDLs, while there may be one, two, or more than three layers of RDLs 43, depending on the routing requirement of the respective InFO package 102.

The RDLs 43 may be formed using any suitable process. For example, in some embodiments, dielectric layer 50 is formed on the molding material 42 and over main die 104 and dummy die 106. In some embodiments, dielectric layer 50 is formed of a polymer, which may be a photo-sensitive material such as polybenzoxazole (PBO), polyimide, benzocyclobutene (BCB), or the like, that may be patterned using lithography. In other embodiments, dielectric layer 50 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. Dielectric layer 50 may be formed by spin coating, lamination, CVD, the like, or a combination thereof. Dielectric layer 50 is then patterned to form openings to expose metal pillars 40 of main die 104 and the through vias 33. In embodiments in which conductive lines 44 are electrically connected to dummy die 106 (see FIG. 13D), electrical connectors on dummy die 106 are exposed as well. In embodiments in which dielectric layer 50 is formed of a photo-sensitive material, the patterning may be performed by exposing dielectric layer 50 in accordance with a desired pattern and developed to remove the unwanted material. Other methods, such as using a patterned mask and etching, may also be used to pattern dielectric layer 50.

A seed layer (not shown) is formed over dielectric layer 50 and in the openings formed in dielectric layer 50. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, or the like. A mask is then formed and patterned on the seed layer in accordance with a desired redistribution pattern, such as the pattern illustrated in FIGS. 13A-D. In some embodiments, the mask is a photoresist formed by spin coating or the like and exposed to light for patterning. The patterning forms openings through the mask to expose the seed layer. A conductive material is formed in the openings of the mask and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed, are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive lines 44 and via connections 48. Dielectric layer 52 is formed over dielectric layer 50 to provide a more planar surface for subsequent layers and may be formed using similar materials and processes as used to form dielectric layer 50. In some embodiments, dielectric layer 52 is formed of polymer, a nitride, an oxide, or the like. In some embodiments, dielectric layer 52 is PBO formed by a spin-on process.

The above process describes the formation of one layer of RDLs 43. The above process may be repeated as desired to form additional RDLs 43 if desired.

Figure 13D:
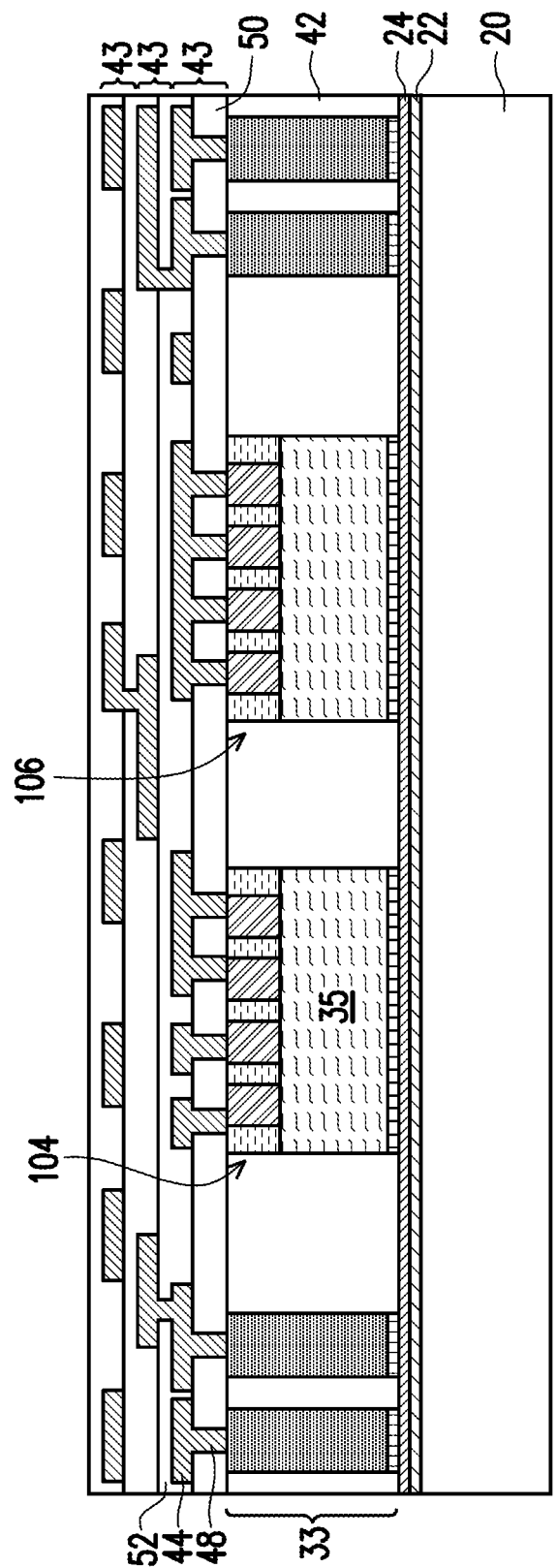
Figure 14A:
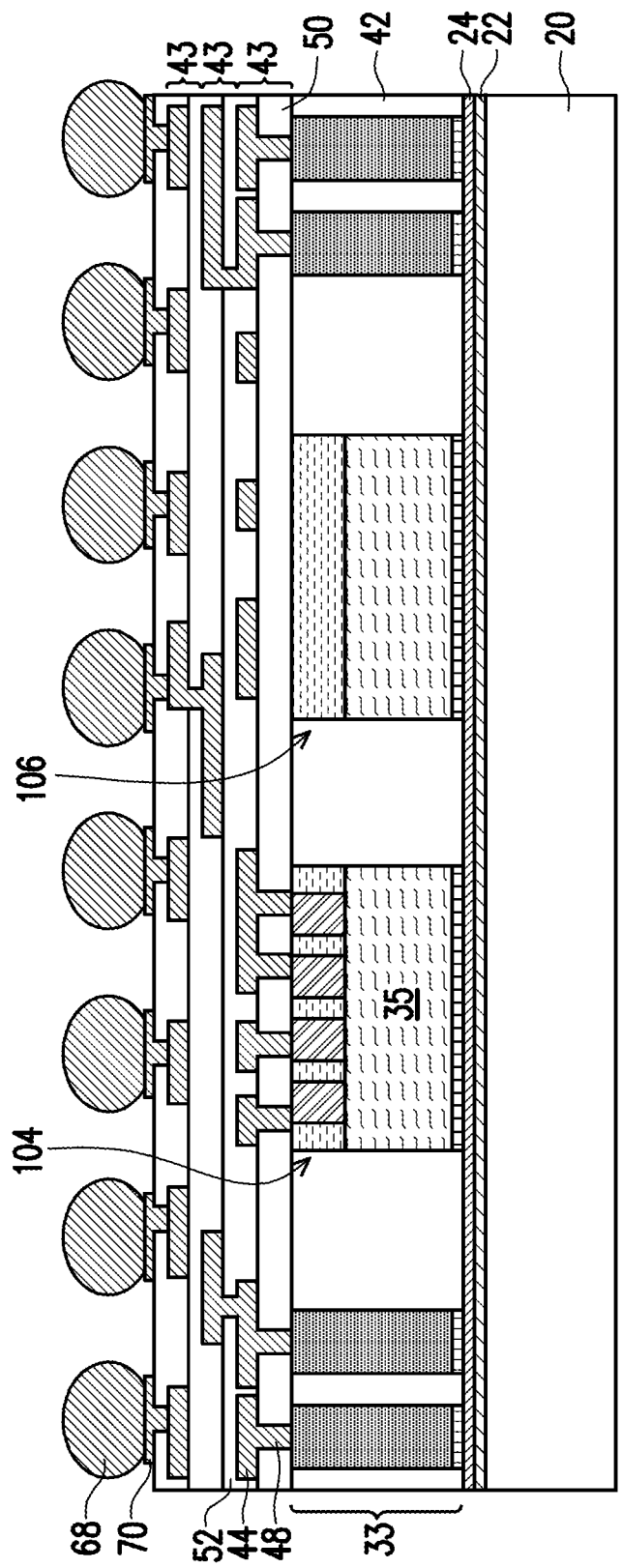
FIGS. 14A, 14B, 14C and 14D are cross-sectional views of an intermediate stage in the manufacture of a fan-out package in accordance with some embodiments.
Figure 14B:
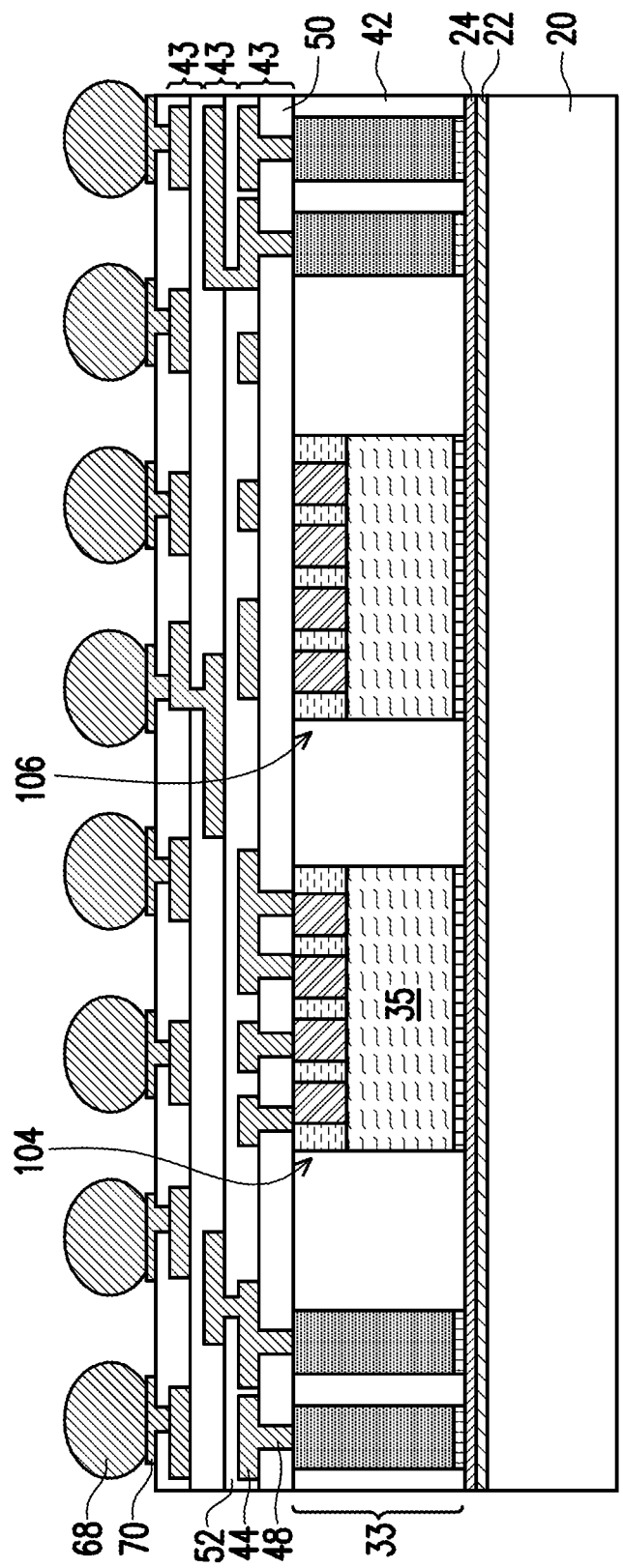
Figure 14C:
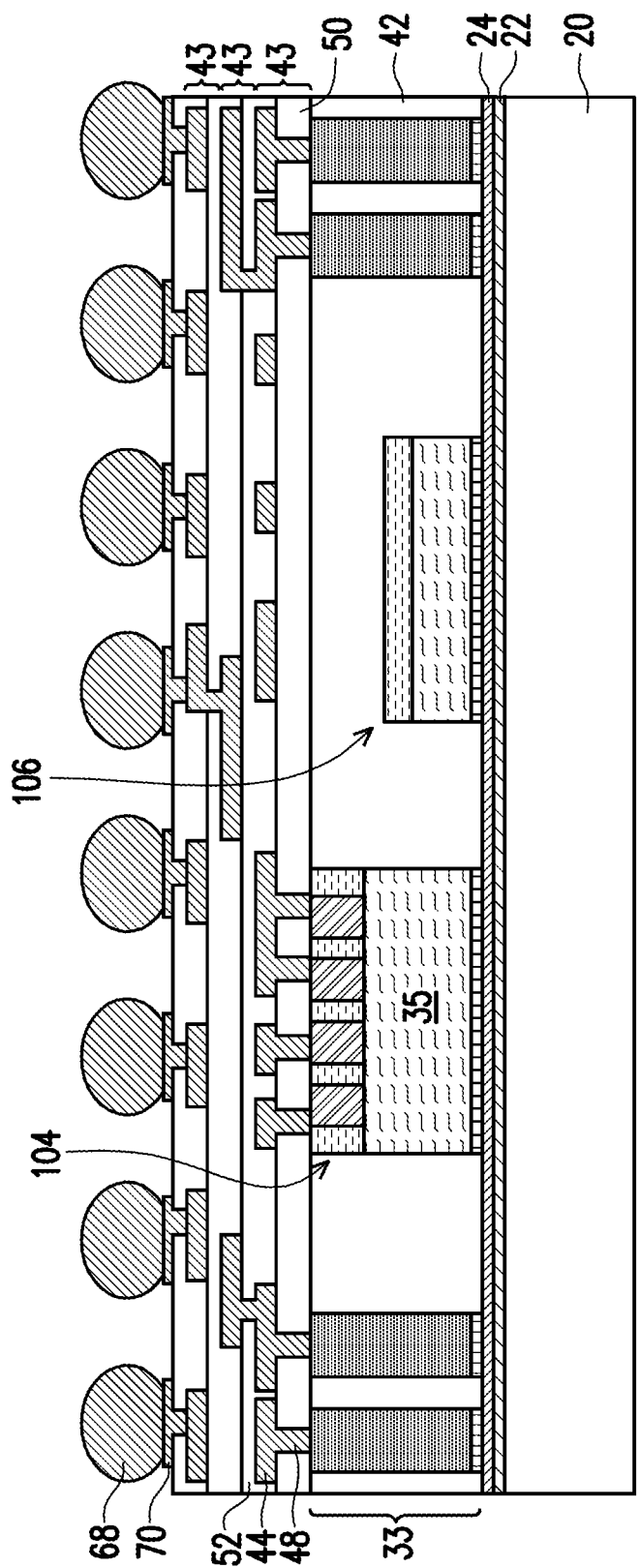
Figure 14D:
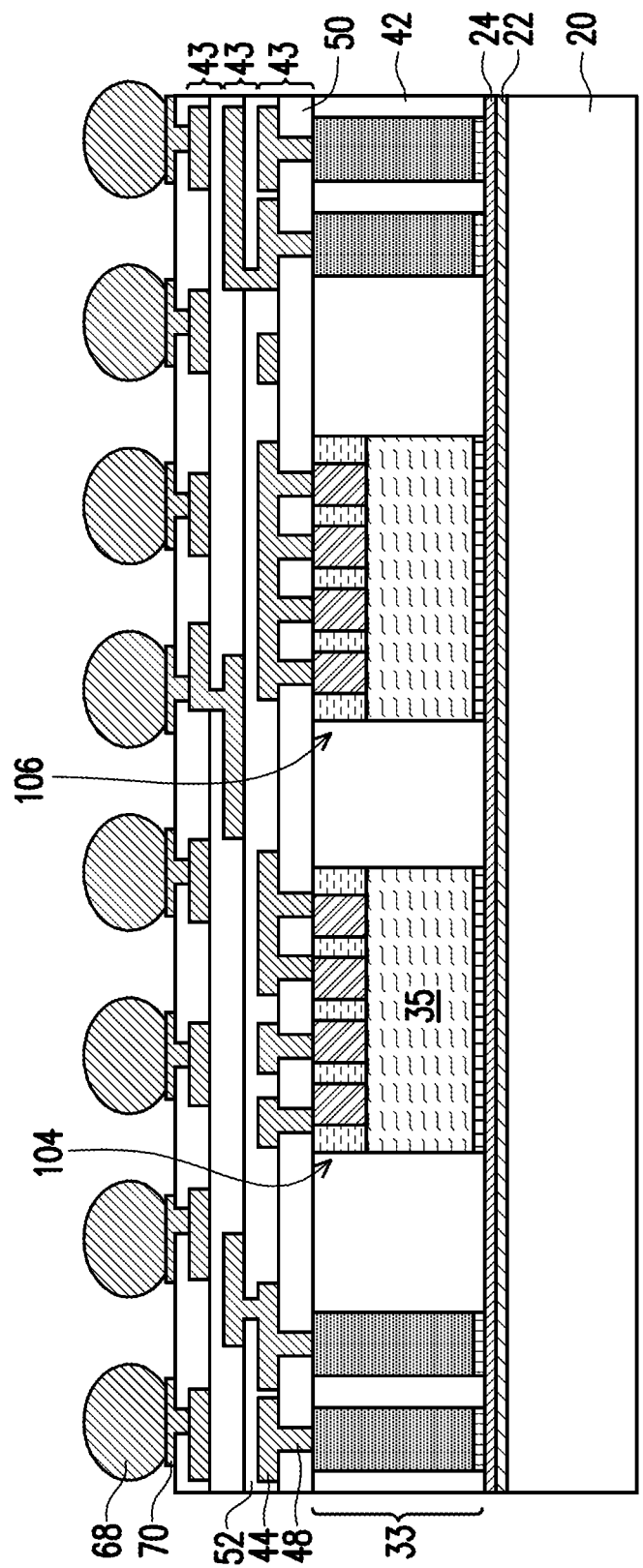
Figure 15A:
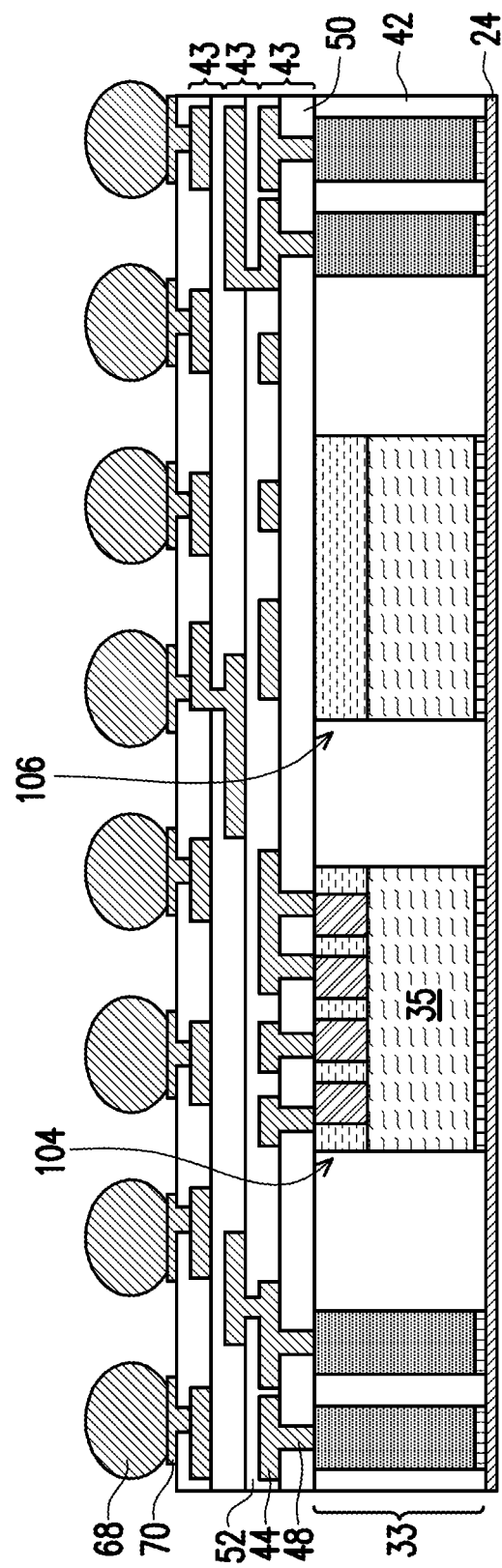
FIGS. 15A, 15B, 15C and 15D are cross-sectional views of an intermediate stage in the manufacture of a fan-out package in accordance with some embodiments.
Figure 15B:
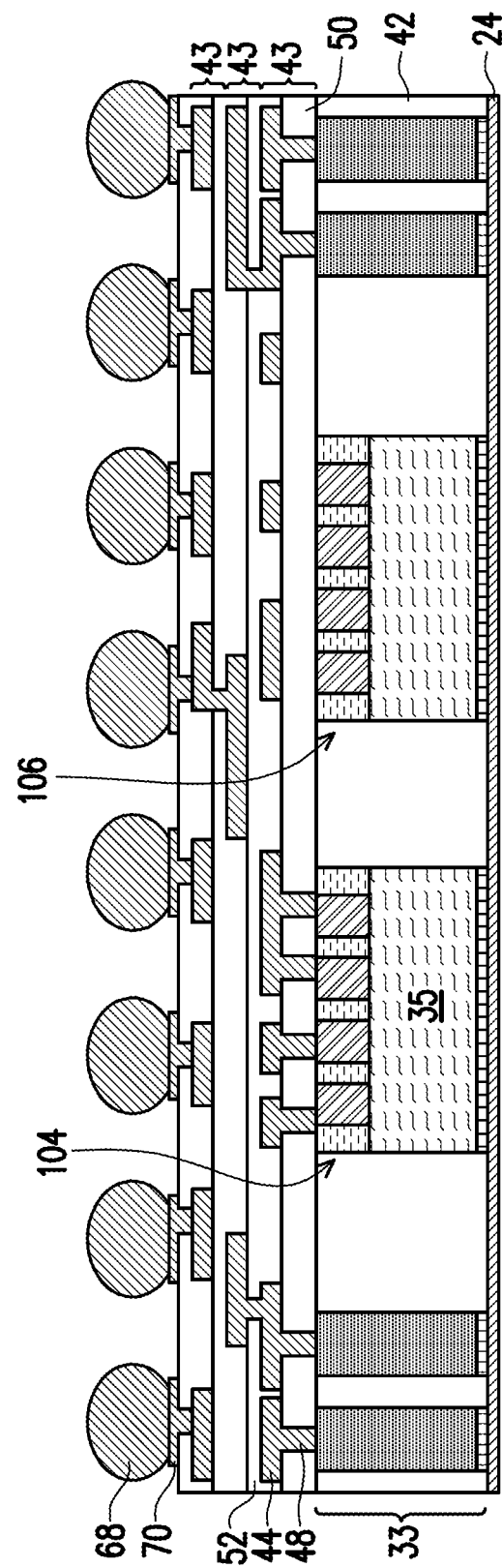
Figure 15C:
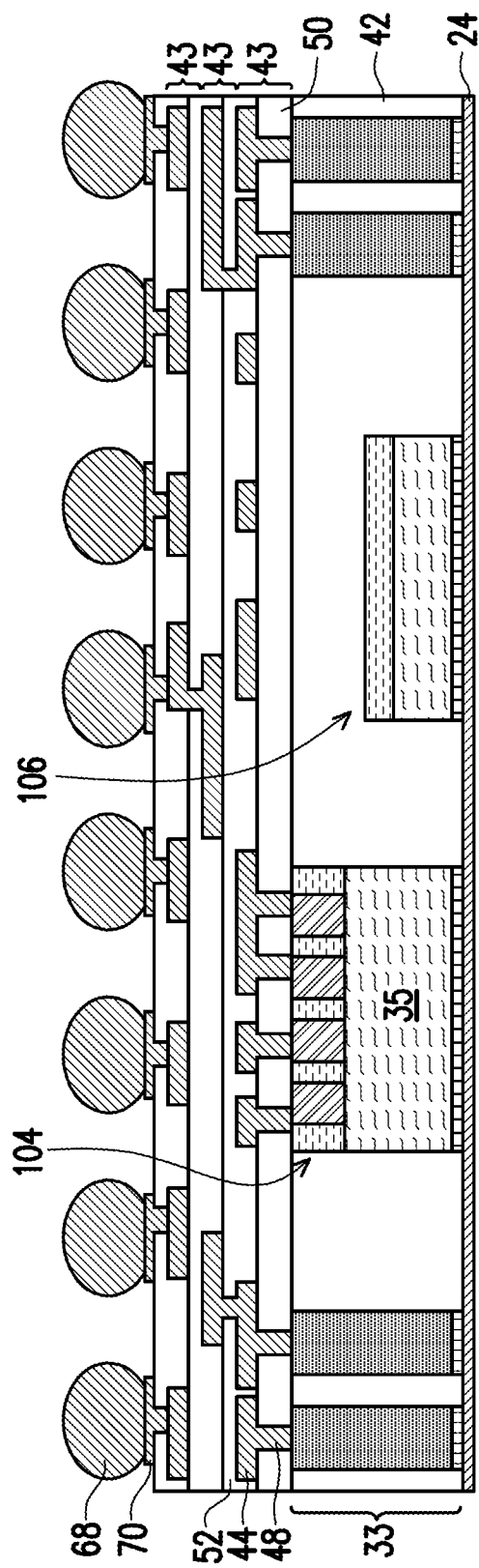
Figure 15D:
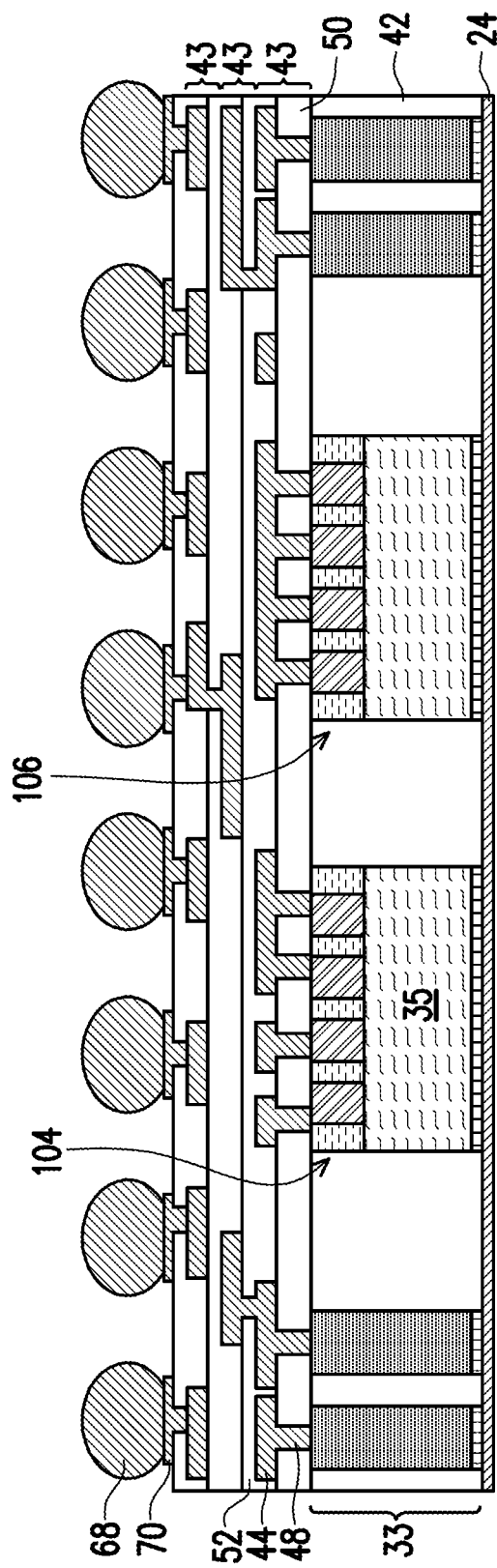

As discussed above, in some embodiments the dummy die 106 is formed without any electrical connectors for electrically connecting the dummy die 106 to external components. As such, there is no need for any via connectors 48 or conductive lines 44 of RDLs 43 for connection to a dummy die 106. Examples of embodiments in which dummy die 106 has no metal pillars 40 are shown in FIGS. 13A and 13C. In other embodiments dummy die 106 may be formed with metal pillars 40 on a surface of dummy die 106 that is farthest from the carrier substrate 20. Examples of embodiments in which the dummy die 106 comprises metal pillars 40 are shown in FIGS. 13B and 13D. As shown in FIG. 13B, in some embodiments no conductive vias 48 or conductive lines 44 of RDLs 43 are formed to connect to metal pillars 40 in dummy dies 106. As such, metal pillars 40 may contact a dielectric layer of RDLs 43 and be electrically isolated from any conductive vias 48 or conductive lines 44 of RDLs 43. Referring to FIG. 13D, in some embodiments conductive vias 48 and conductive lines may be formed in RDL 43 and be electrically connected to metal pillars 40 in dummy die 106. In some embodiments metal pillars 40 of dummy die 106 may be electrically connected to a ground node of InFO package 102 using metal pillars 40.

FIGS. 14A-D illustrate an under bump metallization (UBM) 70 formed and patterned over an uppermost metallization pattern of the structures shown in FIGS. 13A-D in accordance with some embodiments, thereby forming an electrical connection with an uppermost metallization layer. The UBM 70 provides an electrical connection upon which an electrical connector, e.g., a solder ball/bump, a conductive pillar, or the like, may be placed. In an embodiment, the under bump metallization 70 includes a diffusion barrier layer, a seed layer, or a combination thereof. The diffusion barrier layer may include Ti, TiN, Ta, TaN, or combinations thereof. The seed layer may include copper or copper alloys. However, other metals, such as nickel, palladium, silver, gold, aluminum, combinations thereof, and multi-layers thereof, may also be included. In an embodiment, under bump metallization 70 is formed using sputtering. In other embodiments, electro plating may be used.

Connectors 68 are formed over the under bump metallization 70 in accordance with some embodiments. The connectors 68 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 68 may include a conductive material such as solder, copper, aluminum, gold, nickel, silver, palladium, tin, the like, or a combination thereof. In some embodiments, the connectors 68 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors 68 may form a grid, such as a ball grid array (BGA). In some embodiments, a reflow process may be performed, giving the connectors 68 a shape of a partial sphere in some embodiments. Alternatively, the connectors 68 may comprise other shapes. The connectors 68 may also comprise non-spherical conductive connectors, for example.

In some embodiments, the connectors 68 comprise metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

Next, carrier substrate 20 is de-bonded from the package. Release layer 22 is also cleaned from the package. The resulting structure is shown in FIGS. 15A-D. As a result of the removal of release layer 22, buffer layer 24 is exposed.

In subsequent processing (not shown), if a plurality of InFO packages are formed simultaneously, the InFO packages may singulated into a plurality of InFO packages 102.

Figure 16A:
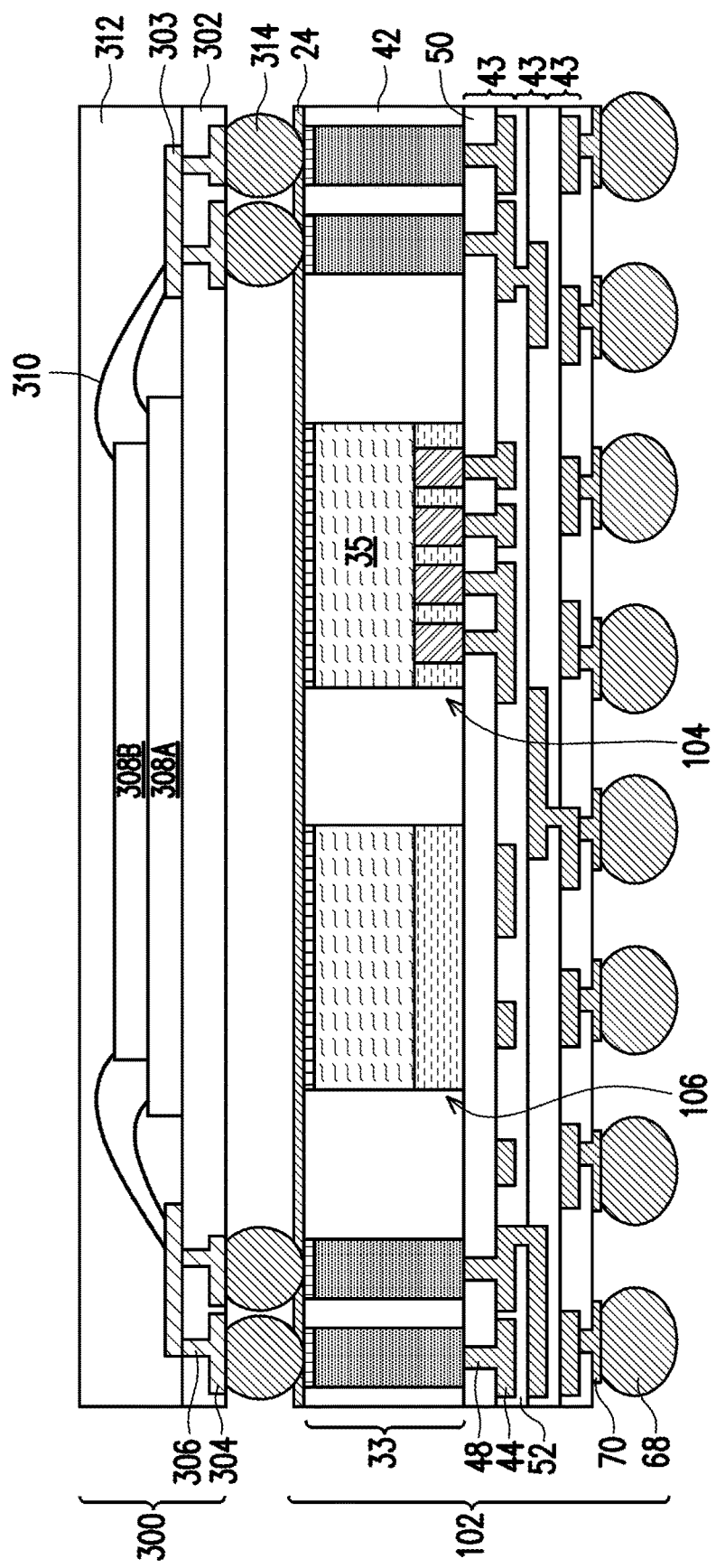
FIGS. 16A, 16B, 16C, and 16D are cross-sectional views of an intermediate stage in the manufacture of a fan-out package in accordance with some embodiments.
Figure 16B:
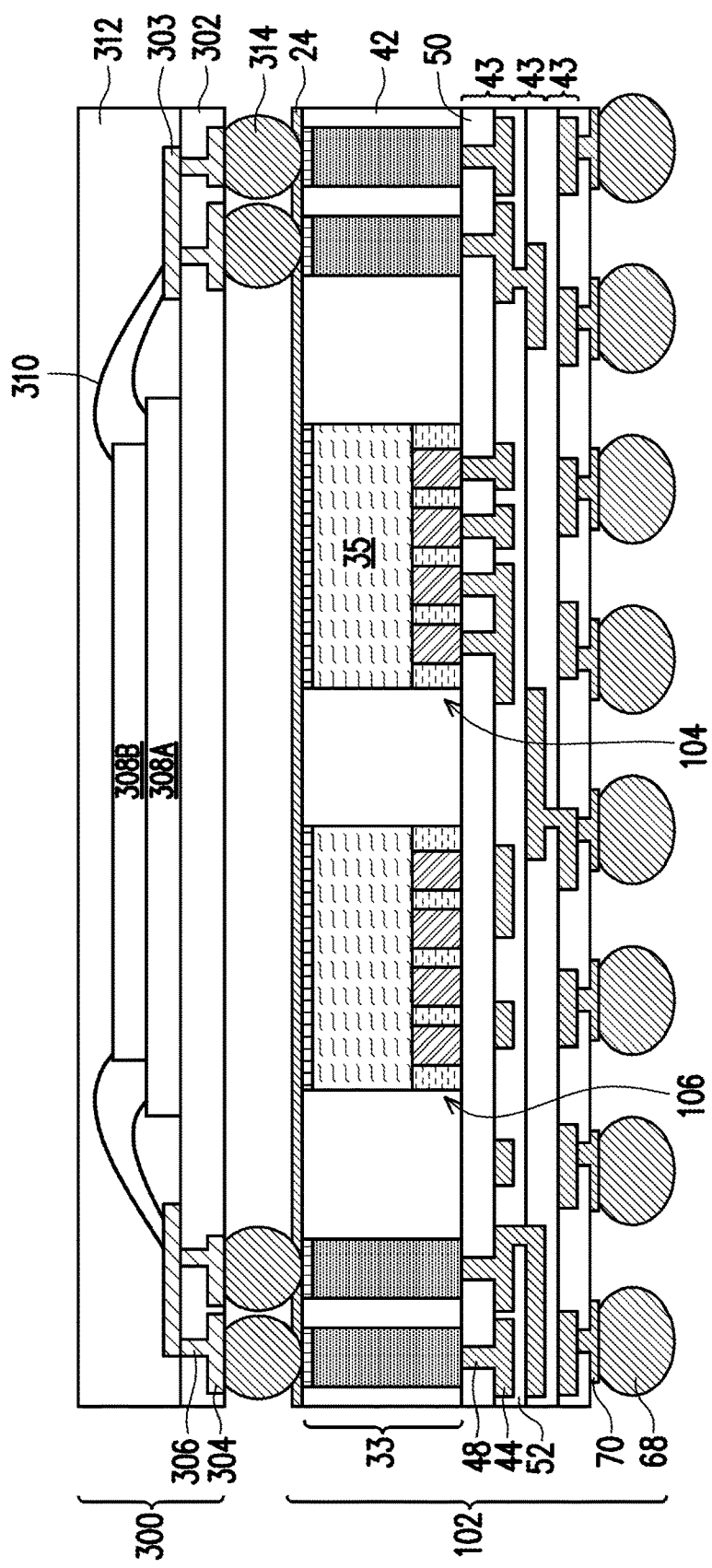
Figure 16C:
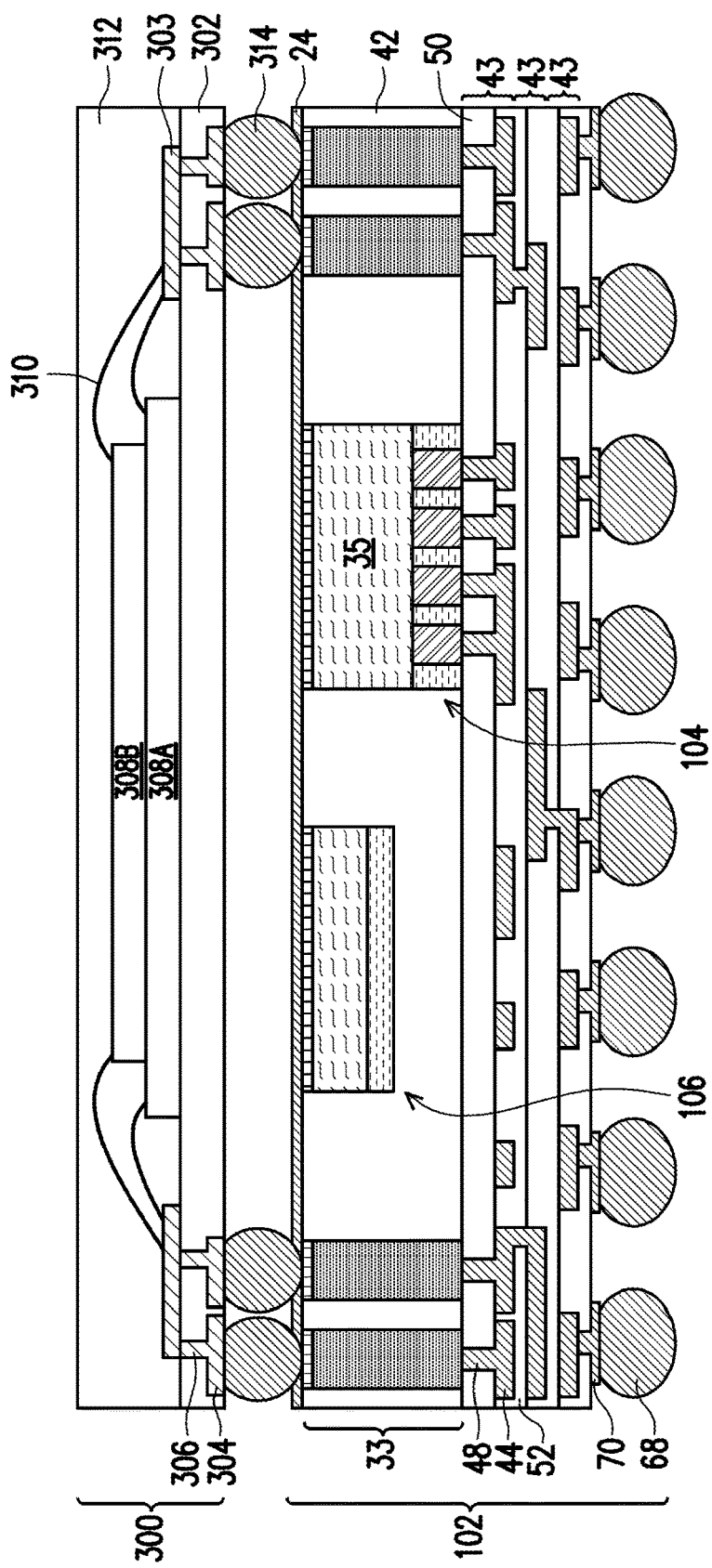
Figure 16D:
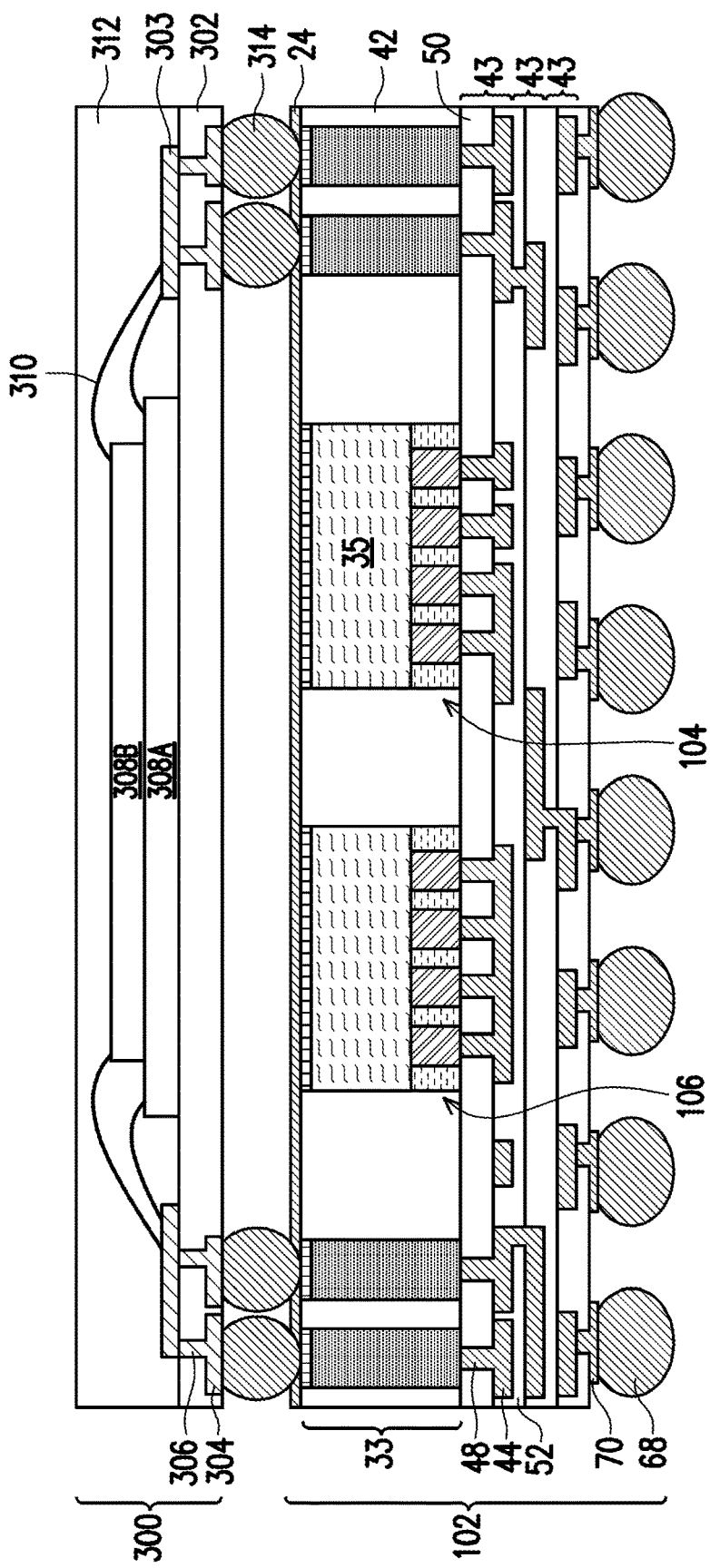

Referring to FIGS. 16A-C, a top package 300 may be bonded to InFO package 102. The top package 300 includes a substrate 302 and one or more stacked dies 308 (308A and 308B) coupled to the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a SOI substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown). As one of ordinary skill in the art will recognize, a wide variety of devices such as transistors, capacitors, resistors, combinations of these, and the like may be used to generate the structural and functional requirements of the design for the semiconductor package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side the substrate 302 to couple to the stacked dies 308, and bond pads 304 on a second side of the substrate 302, the second side being opposite the first side of the substrate 302, to couple to the conductive connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electrochemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof. In an embodiment, the bond pads 303 and 304 are UBMs that are formed using the same or similar processes as described earlier in connection with UBMs 70.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked memory dies 308 may include low-power (LP) double data rate (DDR) memory modules, such as LPDDR1, LPDDR2, LPDDR3, LPDDR4, or the like memory modules.

In some embodiments, the stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing step may be performed to cure the molding material 312, wherein the curing may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second packages 300.

After the top packages 300 are formed, the top packages 300 are bonded to the InFO packages 102 by way of conductive connectors 314 and the bond pads 304. In some embodiments, the stacked memory dies 308 may be coupled to the main die 104 through the wire bonds 310, the bond pads 303 and 304, through vias 306, the conductive connectors 314, and the through vias 33.

The conductive connectors 314 may be similar to the connectors 68 described above and the description is not repeated herein, although the conductive connectors 314 and 68 need not be the same. In some embodiments, before bonding the conductive connectors 314, the conductive connectors 314 are coated with a flux (not shown), such as a no-clean flux. The conductive connectors 314 may be dipped in the flux or the flux may be jetted onto the conductive connectors 314.

In some embodiments, the conductive connectors 314 may have an epoxy flux (not shown) formed thereon before they are reflowed with at least some of the epoxy portion of the epoxy flux remaining after the top package 300 is attached to the InFO package 102. This remaining epoxy portion may act as an underfill to reduce stress and protect the joints resulting from the reflowing the conductive connectors 314. In some embodiments, an underfill (not shown) may be formed between the top package 300 and the InFO package 102 and surrounding the conductive connectors 314. The underfill may be formed by a capillary flow process after the top package 300 is attached or may be formed by a suitable deposition method before the top package 300 is attached.

The bonding between the top package 300 and the InFO package 102 may be a solder bonding or a direct metal-to-metal (such as a copper-to-copper or tin-to-tin) bonding. In an embodiment, the top package 300 is bonded to the InFO package 102 by a reflow process. During this reflow process, the conductive connectors 314 are in contact with the bond pads 304 and the through vias 33 to physically and electrically couple the top package 300 to the InFO package 102.

In accordance with some embodiments, an InFO package includes one or more main dies and one or more dummy dies. A ratio of an area of the InFO package in a plan view to an area of the package covered by main dies and dummy dies is less than about 2.5. The inclusion of the dummy dies and/or the lowering of the ratio to be less than or equal to about 2.5 may improve warpage characteristics of the InFO package. In some embodiments, the InFO package may experience less warpage and/or more symmetrical warpage when the ratio about 2.5 or less.

A structure is provided in accordance with some embodiments. The structure includes one or more main dies and one or more dummy dies, a dummy die of the one or more dummy dies being positioned beside a main die of the one or more main dies. The structure also includes molding material extending along sidewalls of the one or more main dies and the one or more dummy dies. The structure also includes a plurality of redistribution layers including a plurality of vias and a plurality of conductive lines, the one or more main dies extending along a first surface of the plurality of redistribution layers. The structure also includes a plurality of external connectors extending along a second surface of the plurality of redistribution layers, the first surface and the second surface being opposite surfaces of the plurality of redistribution layers.

A structure is provided in accordance with some embodiments. The structure includes one or more main dies. The structure also includes one or more dummy dies, a first dummy die of the one or more dummy dies being positioned beside a main die of the one or more main dies. The structure also includes a plurality of through vias, where a through via of the plurality of through vias is positioned beside a second dummy die of the one or more dummy dies. The structure also includes a molding material extending along sidewalls of the one or more main dies, the one or more dummy dies, and the plurality of through vias. The structure also includes a redistribution layer over the one or more main dies and the one or more dummy dies, where the redistribution layer includes a plurality of conductive lines and a plurality of vias, and where the plurality of conductive lines are electrically connected to the one or more main dies.

Another structure is provided in accordance with some embodiments. The structure includes one or more main dies and one or more dummy dies. The structure also includes a molding material extending along sidewalls of the one or more main dies, the one or more dummy dies, and the plurality of through vias. The structure also includes a redistribution layer over the one or more main dies and the one or more dummy dies, where the redistribution layer includes a plurality of conductive lines and a plurality of vias. An area of the structure in a plan view of the structure is a first area, an area of the structure covered by the one or more main dies and the one or more dummy dies in the plan view of the structure is a second area, and a ratio of the first area to the second area is 2.5 or less.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   one or more main dies;
   one or more dummy dies, a dummy die of the one or more dummy dies being positioned beside a main die of the one or more main dies, and the dummy die of the one or more dummy dies comprising a polymer layer disposed over a substrate, the polymer layer defining a surface of the dummy die of the one or more dummy dies;
   molding material extending along sidewalls of the one or more main dies and the one or more dummy dies; and
   a plurality of redistribution layers comprising a plurality of vias and a plurality of conductive lines, wherein each of the plurality of redistribution layers is disposed at a same level of the structure, the one or more main dies contact a first surface of the plurality of redistribution layers, and the dummy die of the one or more dummy dies is disposed in a manner that the surface of the dummy die defined by the polymer layer is closest to the first surface of the plurality of redistribution layers, and the polymer layer extends between the substrate and the first surface of the plurality of redistribution layers; and a plurality of external connectors disposed on a second surface of the plurality of redistribution layers, the first surface and the second surface being opposite surfaces of the plurality of redistribution layers.

2. The structure according to claim 1, wherein an area of the structure in a plan view of the structure is a first area, an area of the structure covered by the one or more main dies and the one or more dummy dies in the plan view of the structure is a second area, and a ratio of the first area to the second area is 2.5 or less.

3. The structure according to claim 1, wherein the dummy die of the one or more dummy dies comprises a plurality of metal pillars disposed in the polymer layer of the dummy die of the one or more dummy dies.

4. The structure according to claim 3, wherein the dummy die of the one or more dummy dies does not comprise an electrical connector in the polymer layer of the dummy die of the one or more dummy dies.

5. The structure according to claim 1, wherein a substrate of the one or more main dies comprises a same material as the substrate of the one or more dummy dies.

6. The structure according to claim 5, wherein an effective CTE of the one or more main dies is substantially the same as an effective CTE of the one or more dummy dies.

7. The structure according to claim 6, wherein a thickness of the dummy die of the one or more dummy dies is less than a thickness of a main die of the one or more main dies, wherein the thickness of the main die of the one or more main dies and the dummy die of the one or more dummy dies is measured in a direction that is perpendicular to a major surface of the main die of the one or more main dies.

8. The structure according to claim 1, wherein the dummy die of the one or more dummy dies comprises electric connectors exposed along the surface of the dummy die that is closest to the first surface of the plurality of redistribution layers.

9. The structure according to claim 8, wherein a via of the plurality of vias is electrically connected to an electrical connector of the electrical connectors of the dummy die of the one or more dummy dies.

10. The structure according to claim 9, wherein the via of the plurality of vias electrically connects the electrical connector of the electrical connectors of the dummy die of the one or more dummy dies to a ground node.

11. The structure according to claim 8, wherein the electrical connectors of the one or more dummy dies are electrically isolated from the plurality of vias and the plurality of conductive lines of the plurality of redistribution layers.

12. The structure according to claim 1, wherein the molding material covers the surface of the one or more dummy dies that is closest to the first surface of the plurality of redistribution layers.

13. A structure, comprising:
one or more main dies;
one or more dummy dies, a first dummy die of the one or more dummy dies being positioned beside a main die of the one or more main dies;

a plurality of through vias, wherein a through via of the plurality of through vias is positioned beside a second dummy die of the one or more dummy dies;
a molding material extending along sidewalls of the one or more main dies, the one or more dummy dies, and the plurality of through vias; and
a redistribution layer over the one or more main dies and the one or more dummy dies, wherein the redistribution layer comprises a plurality of conductive lines and a plurality of vias, and wherein the plurality of conductive lines are electrically connected to the one or more main dies.

14. The structure according to claim 13, wherein an area of the structure in a plan view of the structure is a first area, an area of the structure covered by the one or more main dies and the one or more dummy dies in the plan view of the structure is a second area, and a ratio of the first area to the second area is 2.5 or less.

15. The structure according to claim 13, wherein a thickness of the one or more dummy dies is less than a thickness of the one or more main dies, the thickness of the one or more dummy dies and the thickness of the one or more main dies being measured in a direction that is perpendicular to a major surface of the one or more dummy dies.

16. The structure according to claim 13, wherein a conductive line of the plurality of conductive lines electrically connects a dummy die of the one or more dummy dies to a ground node.

17. A structure, comprising:
one or more main dies;
one or more dummy dies, wherein a dummy die of the one or more dummy dies is positioned beside a main die of the one or more main dies;
a molding material extending along sidewalls of the one or more main dies and the one or more dummy dies; and
a redistribution layer over the one or more main dies and the one or more dummy dies, wherein the redistribution layer comprises a plurality of conductive lines and a plurality of vias; and
wherein an area of the structure in a plan view of the structure is a first area, an area of the structure covered by the one or more main dies and the one or more dummy dies in the plan view of the structure is a second area, and a ratio of the first area to the second area is 2.5 or less.

18. The structure according to claim 17, wherein the dummy die of the one or more dummy dies comprises a polymer layer at a surface of the dummy die that is closest to the redistribution layer, wherein electrical connectors do not extend through the polymer layer.

19. The structure according to claim 18, wherein the polymer layer contacts a dielectric layer, the redistribution layer being disposed in the dielectric layer.

20. The structure according to claim 18, further comprising a plurality of through vias extending through the molding material, wherein a through via of the plurality of through vias is positioned next to the dummy die of the one or more dummy dies.

* * * * *

UNITED STATES PATENT AND TRADEMARK OFFICE
CERTIFICATE OF CORRECTION

PATENT NO. : 10,163,802 B2
APPLICATION NO. : 15/583690
DATED : December 25, 2018
INVENTOR(S) : Yan-Fu Lin et al.

It is certified that error appears in the above-identified patent and that said Letters Patent is hereby corrected as shown below:

On the Title Page

Item (73) Assignee, Line 1, delete "Semicondcutor" and insert --Semiconductor--.

Signed and Sealed this
Fourteenth Day of May, 2019

Andrei Iancu
*Director of the United States Patent and Trademark Office*